US008624747B2

(12) United States Patent
Davis

(10) Patent No.: US 8,624,747 B2
(45) Date of Patent: Jan. 7, 2014

(54) ROLL-LOCK SNAP-ON CURRENT TRANSFORMER

(76) Inventor: Edward Lee Davis, Tigard, OR (US)

( * ) Notice: Subject to any disclaimer, the term of this patent is extended or adjusted under 35 U.S.C. 154(b) by 226 days.

(21) Appl. No.: 13/112,388

(22) Filed: May 20, 2011

(65) Prior Publication Data
US 2012/0218114 A1 Aug. 30, 2012

Related U.S. Application Data

(60) Provisional application No. 61/347,184, filed on May 21, 2010.

(51) Int. Cl.
G08B 21/00 (2006.01)
G01R 21/00 (2006.01)

(52) U.S. Cl.
USPC ...... 340/646; 340/538; 340/310.06; 324/126; 324/127

(58) Field of Classification Search
USPC ......... 340/538, 538.15, 539.1, 646, 657, 660, 340/661, 663, 310.16, 531, 310.01, 310.06, 340/310.07; 324/126, 127, 530, 539, 629; 700/292, 295; 361/62, 93.2, 93.8
See application file for complete search history.

(56) References Cited

U.S. PATENT DOCUMENTS 4,689,752 A * 8/1987 Fernandes et al. ............ 700/292
4,794,327 A * 12/1988 Fernandes ..................... 324/126
4,855,671 A * 8/1989 Fernandes ..................... 324/127
6,222,714 B1 * 4/2001 Hoffman ...................... 361/93.2
2011/0121654 A1 * 5/2011 Recker et al. .................. 307/66

OTHER PUBLICATIONS

"HIOKI Clamp Sensor Series—Wide-band Models from DC to 100MHz," downloaded from http://www.hioki.com/product/pdf/CLAMPE4-8ZM.pdf, on May 17, 2011, 8 pages.
"MTL4523/R-MTL5523 Solenoid/Alarm Driver with line fault detection, LLC," downloaded from http://www.mtl-inst.com/images/uploads/datasheets/4500_5500/MTLx523.pdf, on May 17, 2011, 1 page.
"MTL4523V-MTL5523V Solenoid/Alarm Driver with line fault detection, LLC," downloaded from http://www.mtl-inst.com/images/uploads/datasheets/4500_5500/MTLx523V.pdf, on May 17, 2011, 1 page.
"Cutler-Hammer, Instructions for LFP Current Limiter for F-Frame Series C and FB Circuit Breakers, and ELC Current Limiter for F-Frame Series C HMCP's," dated Mar. 1987, 2 pages.
"AB DE-ION Circuit Breakers, LFB Current Limiter for Type FB, 3 Pole, Thermal Magnetic Breakers," dated Oct. 1997, 1 page.

* cited by examiner

Primary Examiner — Van T. Trieu

(57) ABSTRACT

A PeakPower Energy Management and Control System having one or more roll-lock snap-on current transformer power monitoring devices, each to avoid interrupting power when installing current and/or power monitors. Each roll-lock snap-on current transformer power monitoring device may be snapped onto existing power wires inside a power panel or near equipment being monitored without disconnecting any wires or turning off power. Each roll-lock snap-on current transformer power monitoring device may be utilized in standalone mode as well as within a PeakPower Energy Management and Control System in accordance with disclosed embodiments. Each roll-lock snap-on current transformer power monitoring device may communicate via the power lines (Power Line Controller) or communicate via wireless using an integrated microprocessor based RF transceiver.

21 Claims, 24 Drawing Sheets

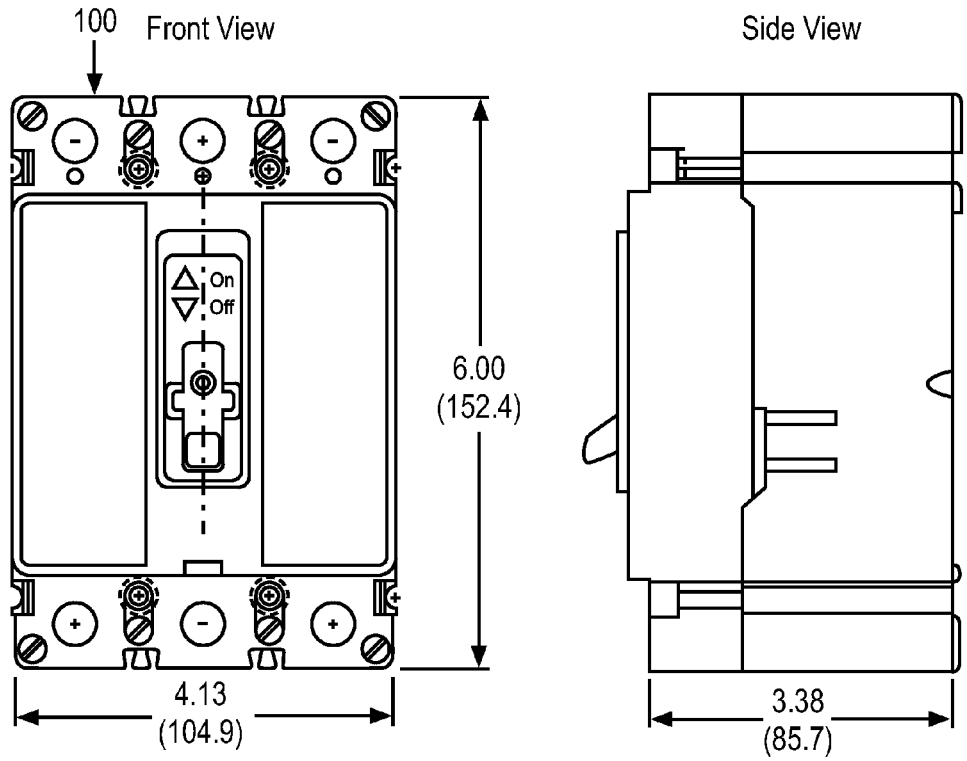
FIG. 1a  Prior Art  Three Phase Circuit Breaker Mechanical Drawing
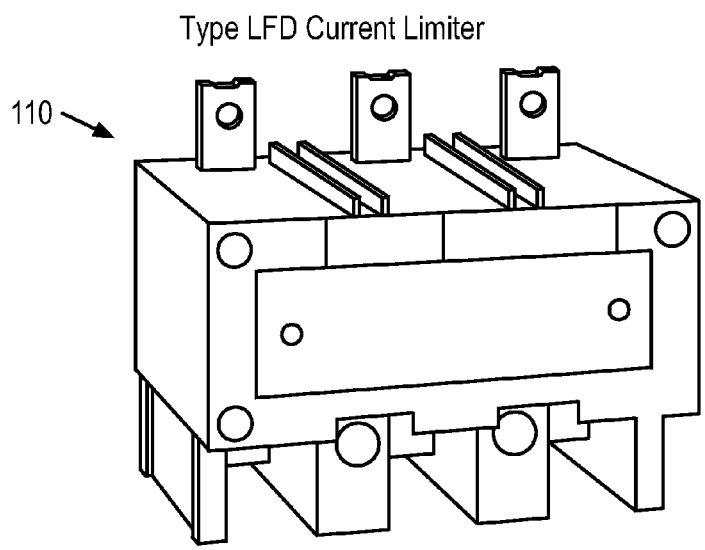
FIG. 1b  Prior Art  LFD Current Limiter

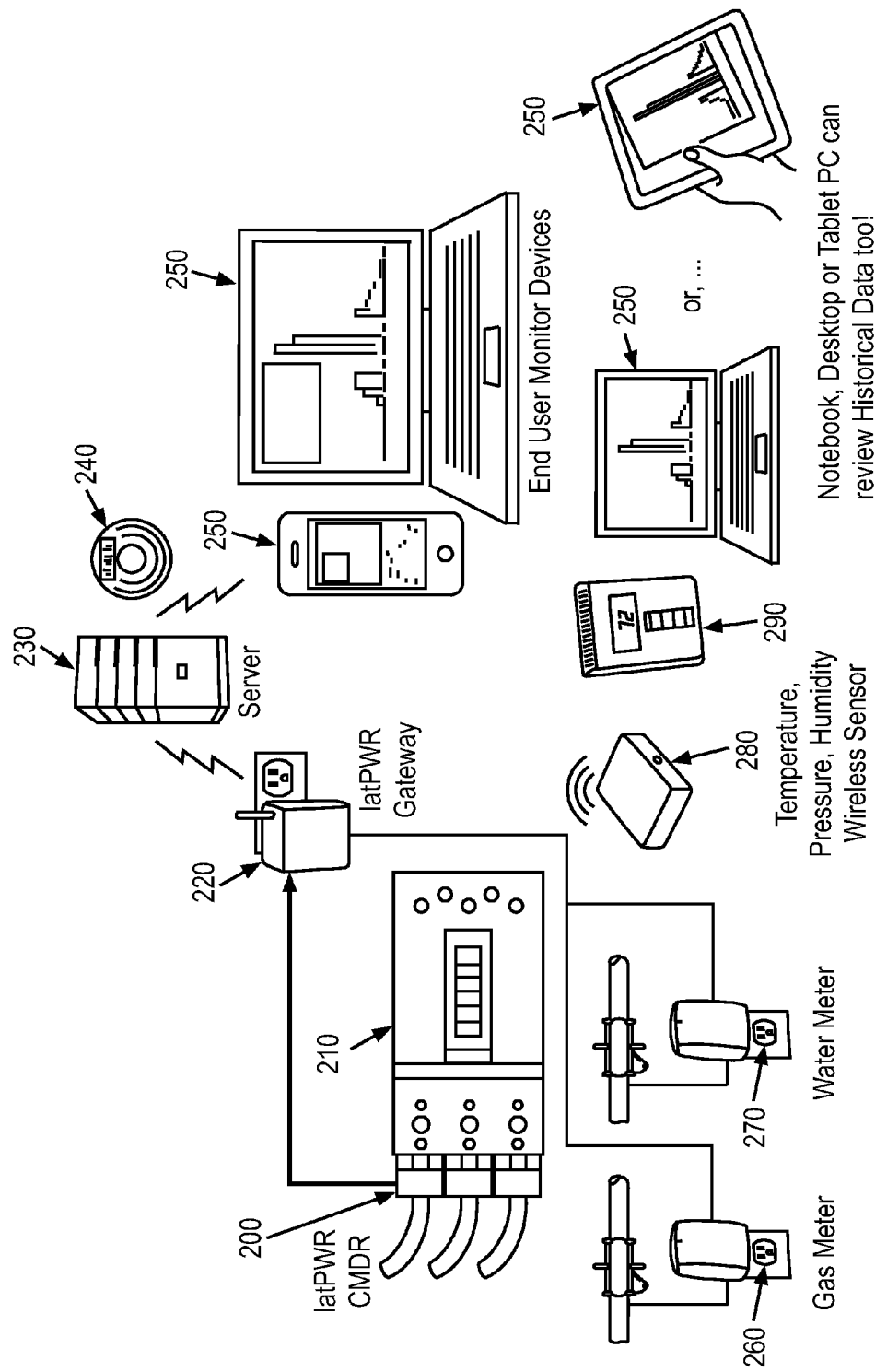
FIG. 2 The PeakPower System Components

FIG. 4  The PeakPower Commander Module containing three RLSO-CT's

FIG. 5  The Roll-Lock SnapOn Current Transformer used as current measuring device

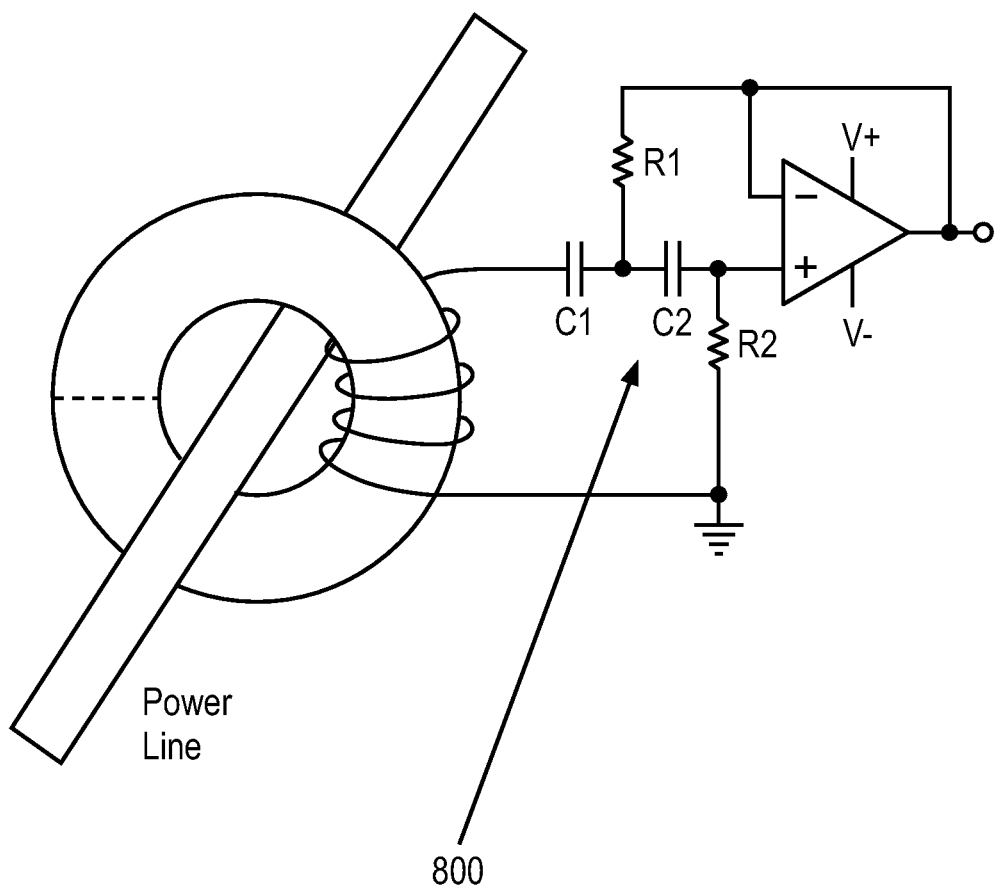
FIG. 8  One or more of the CT's may be used for communications over the power line(s), Receive

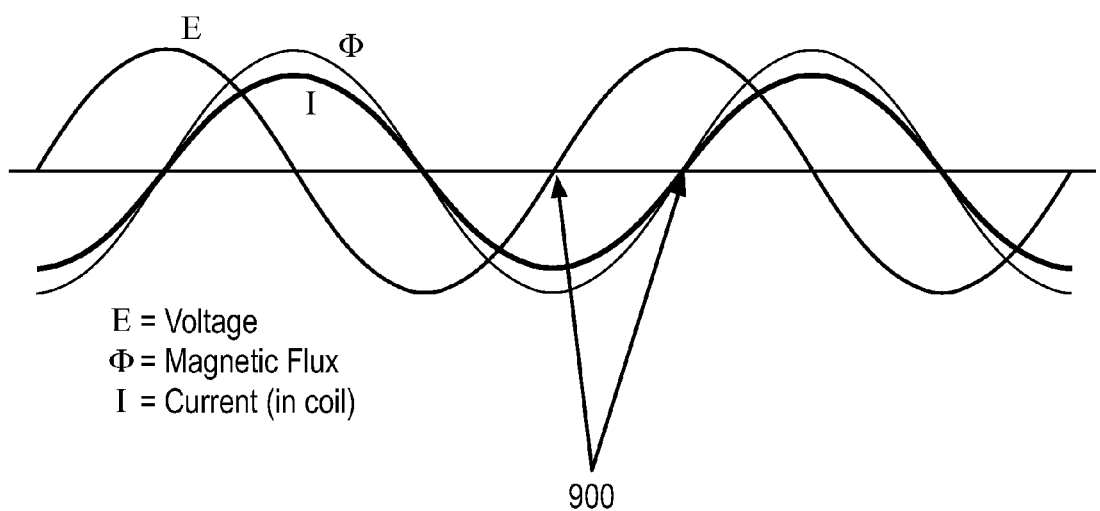
FIG. 9 Voltage Zero Crossings versus Current Zero Crossings

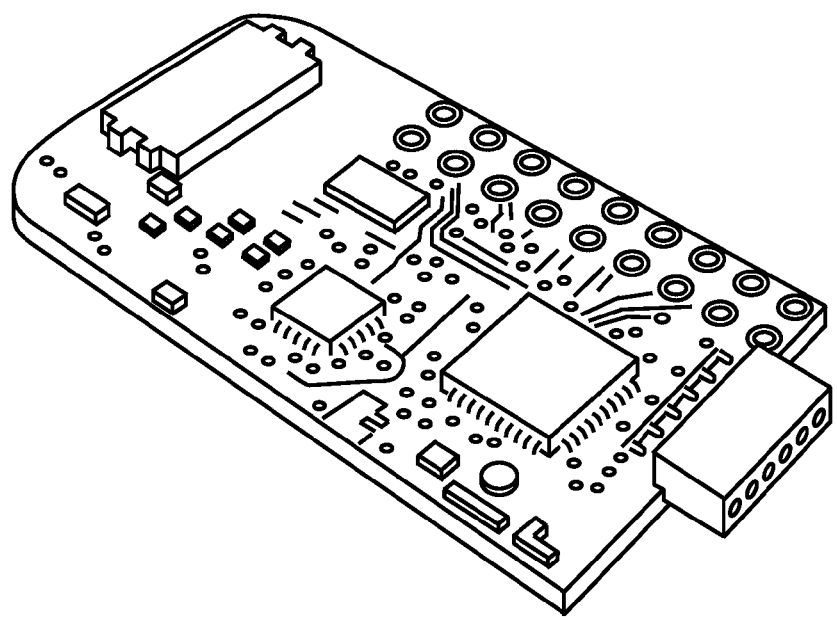
FIG. 10  Wireless RF Module (~433 MHz, ~900 MHz, ~2.4 GHz,...)

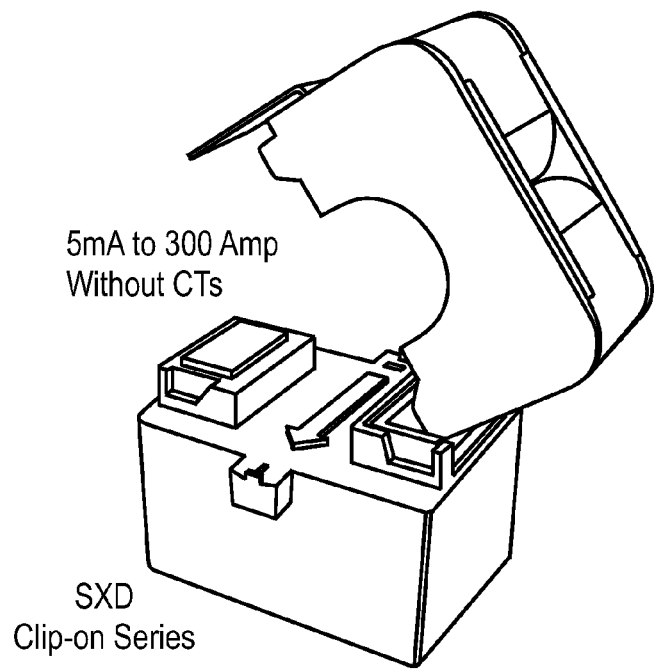
FIG. 11 Prior Art  Hinged Clamp Type Current Transformer
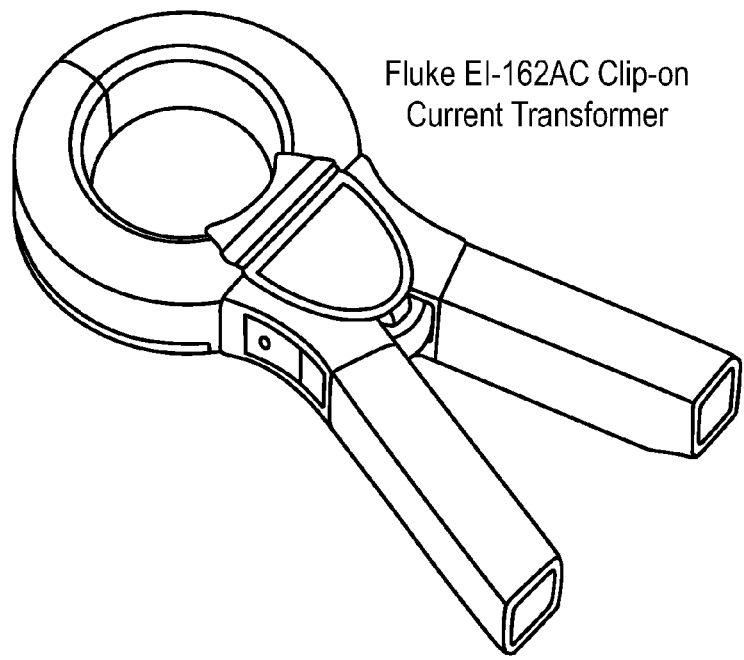
FIG. 12 Prior Art  Squeeze Clip-on Type Current Transformer

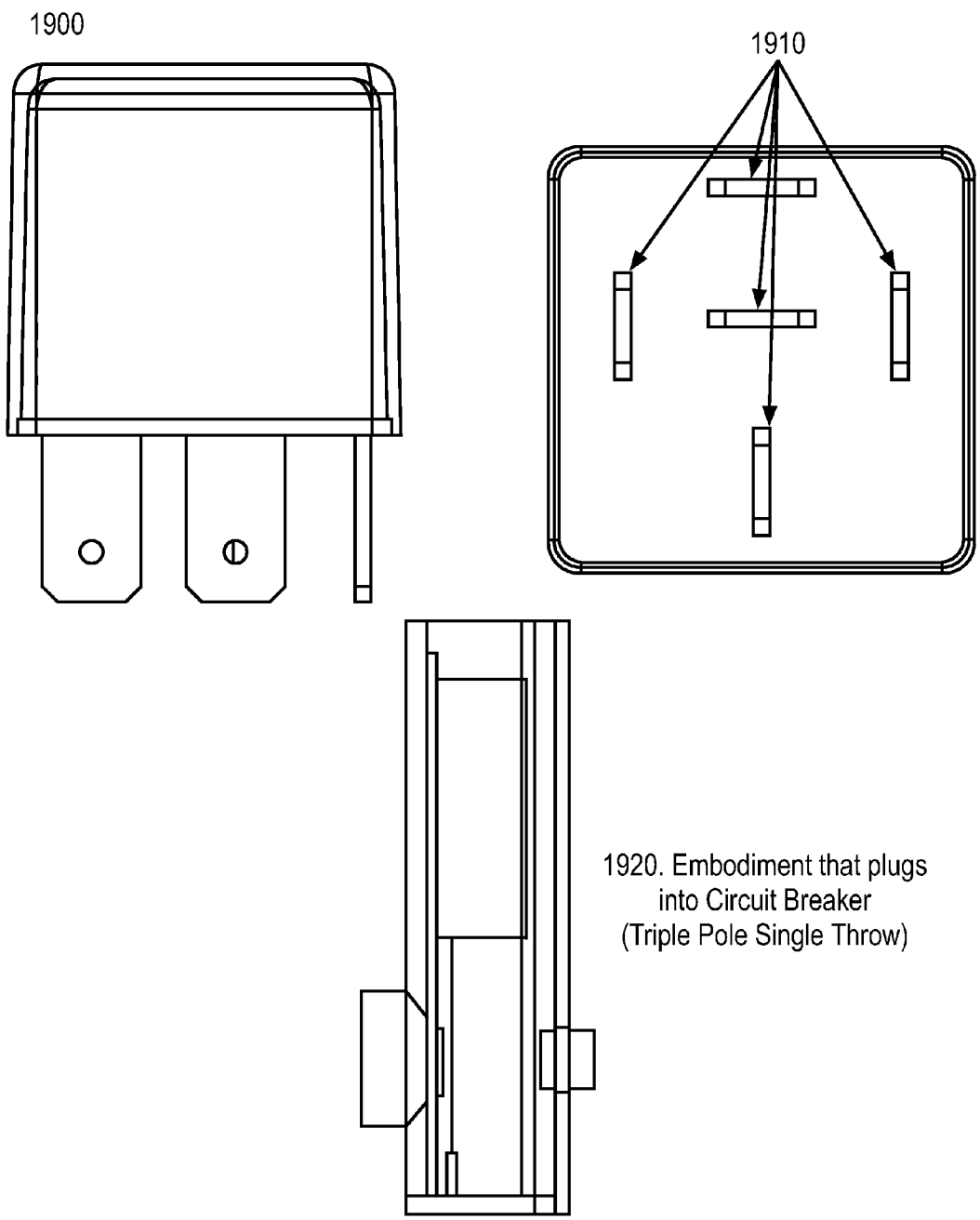
FIG. 19  Multi-Stable Relay Mechanical Drawings

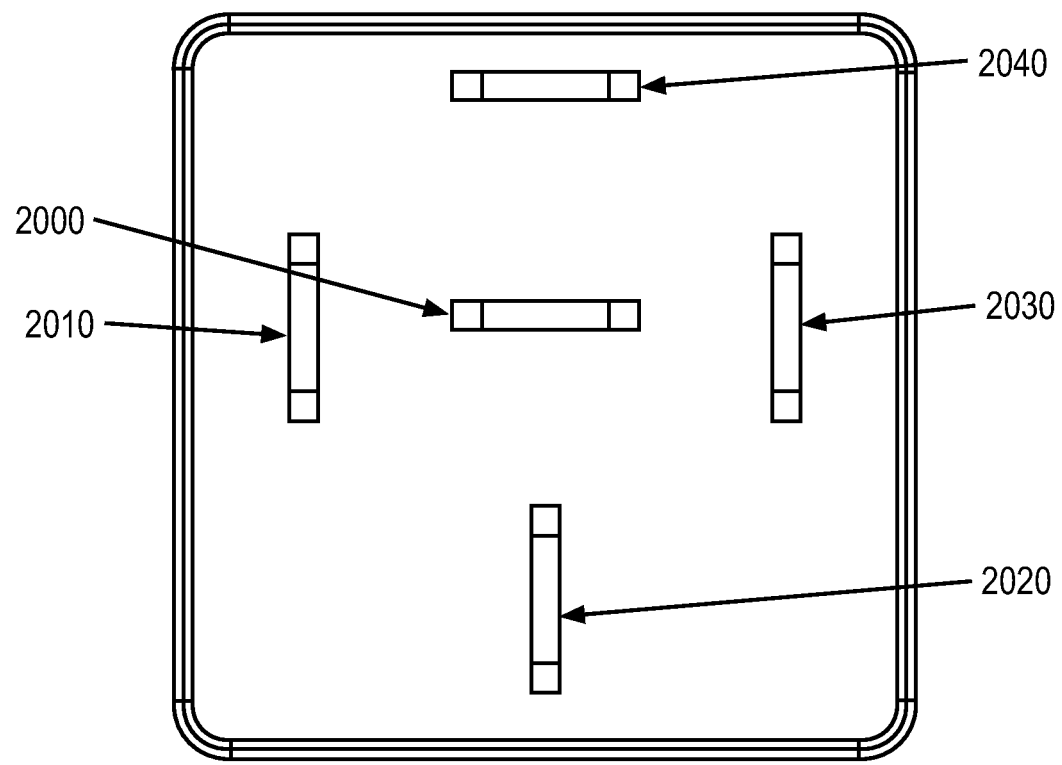
FIG. 20  Multi-Stable Relay bottom view

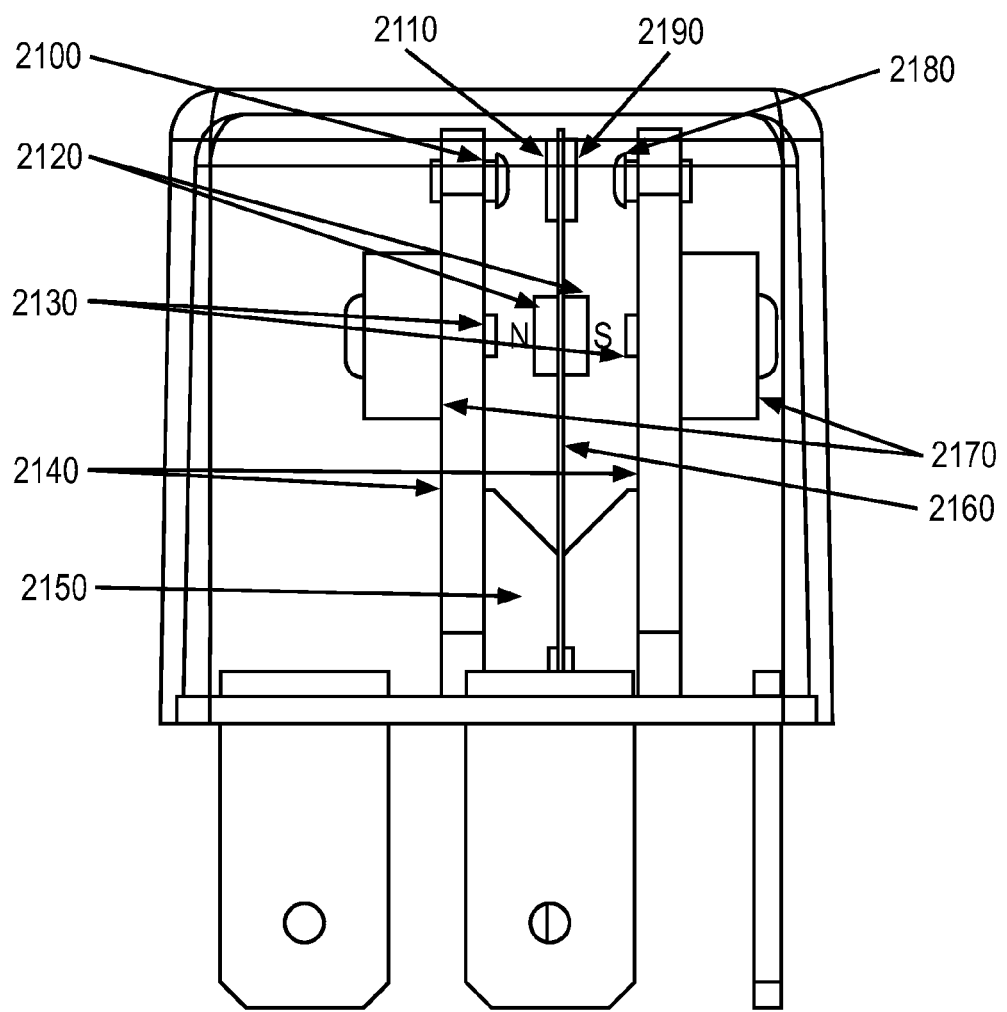
FIG. 21  Multi-Stable Relay top view

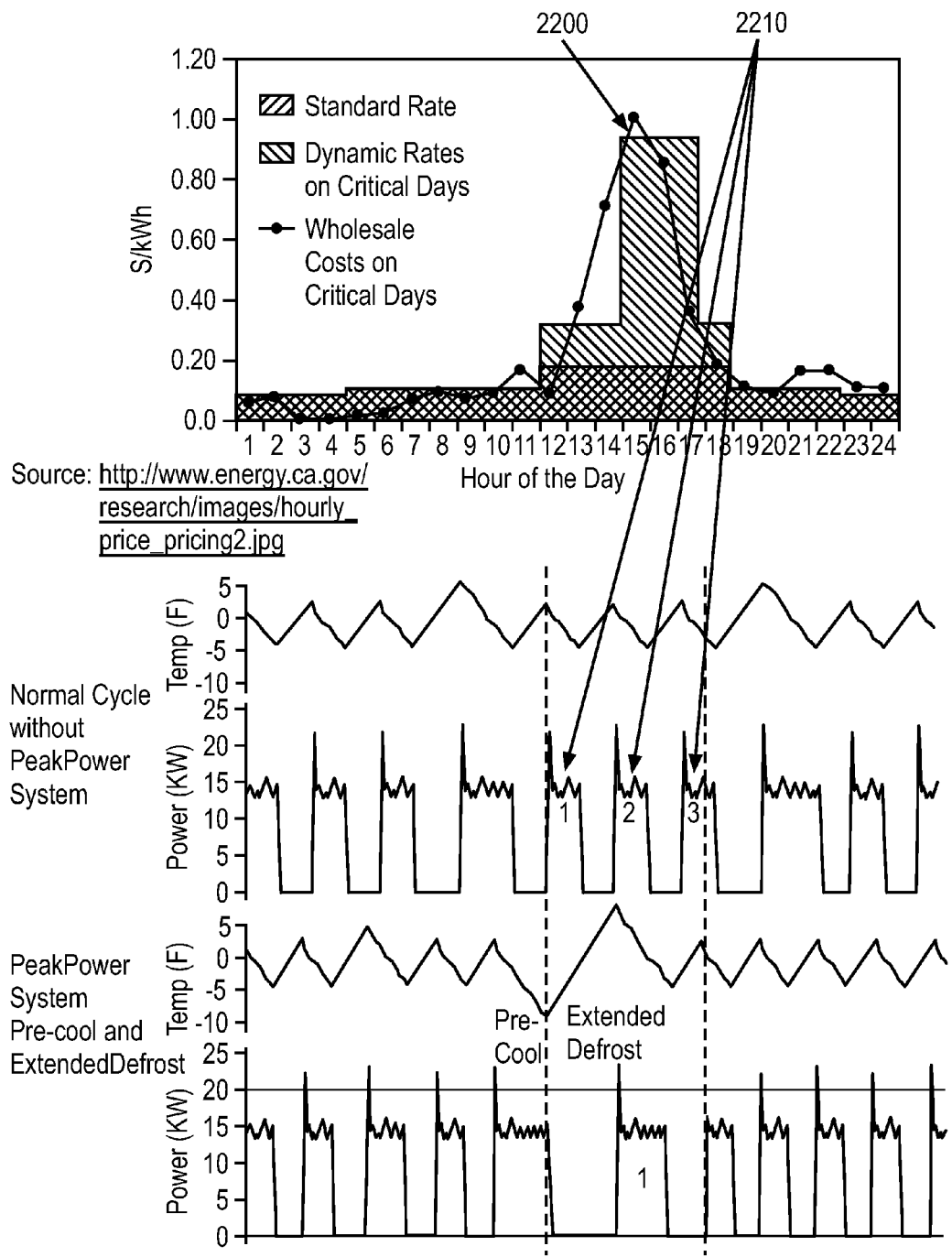
FIG. 22  PeakPower System flattens costly peak power usage

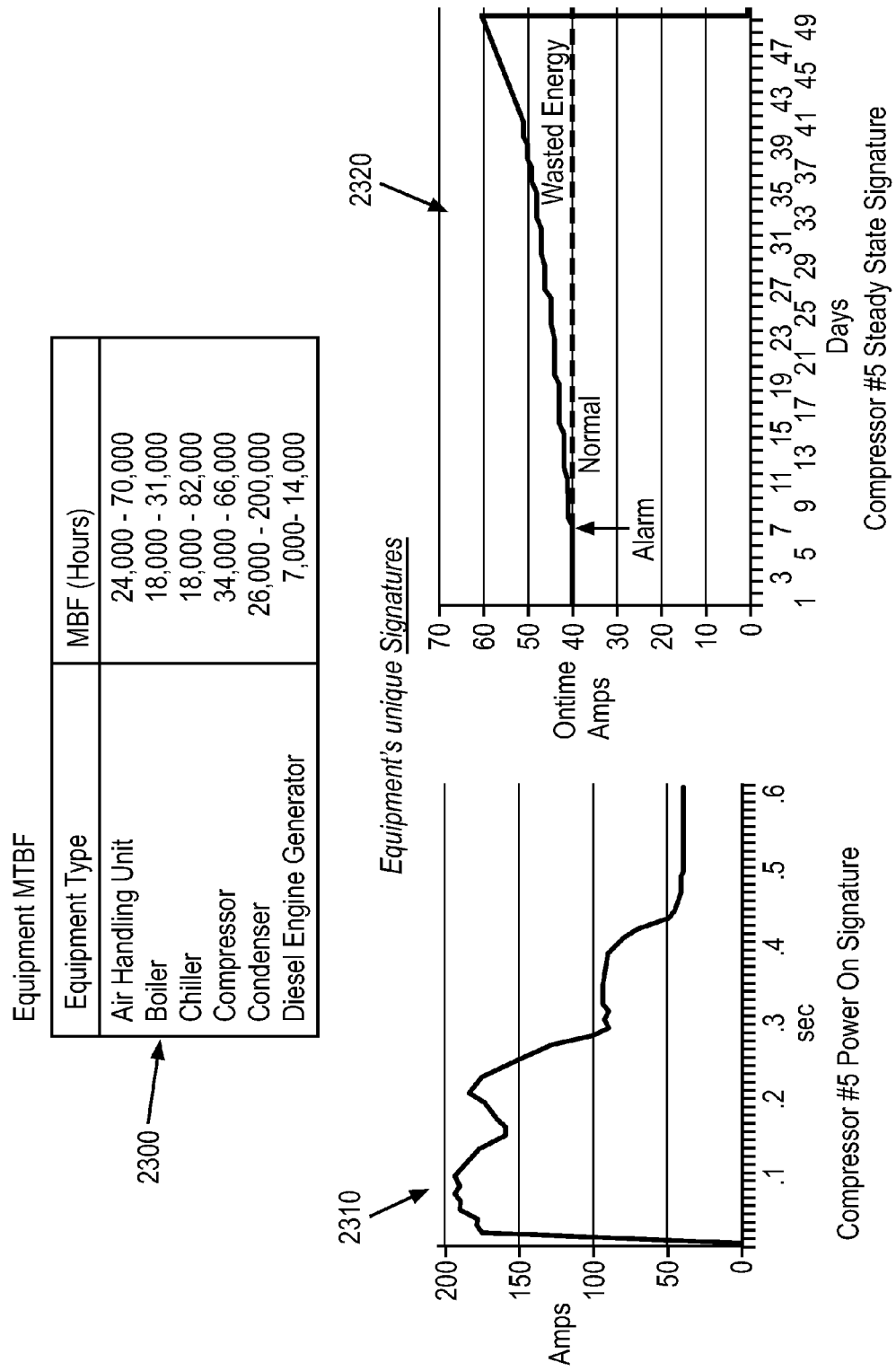
FIG. 23  All Equipment has a Mean Time Before Failure (MTBF) and a signature !

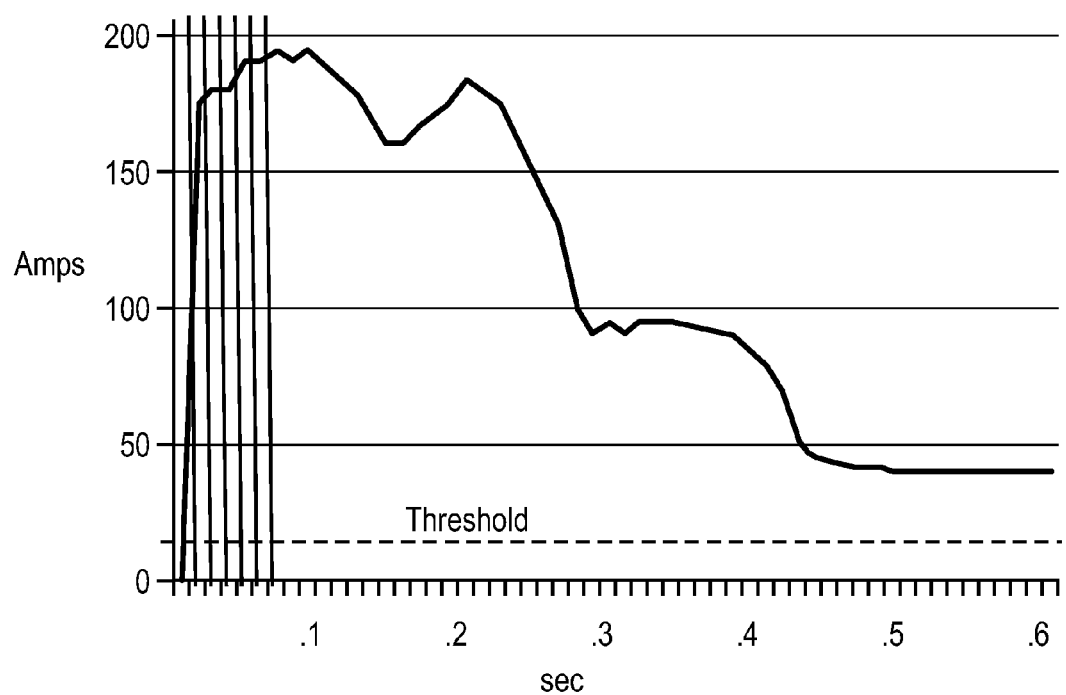
FIG. 24  A compressor Power-On Signature showing Analog to Digital sampling rate during Power on is about 100 Hz.

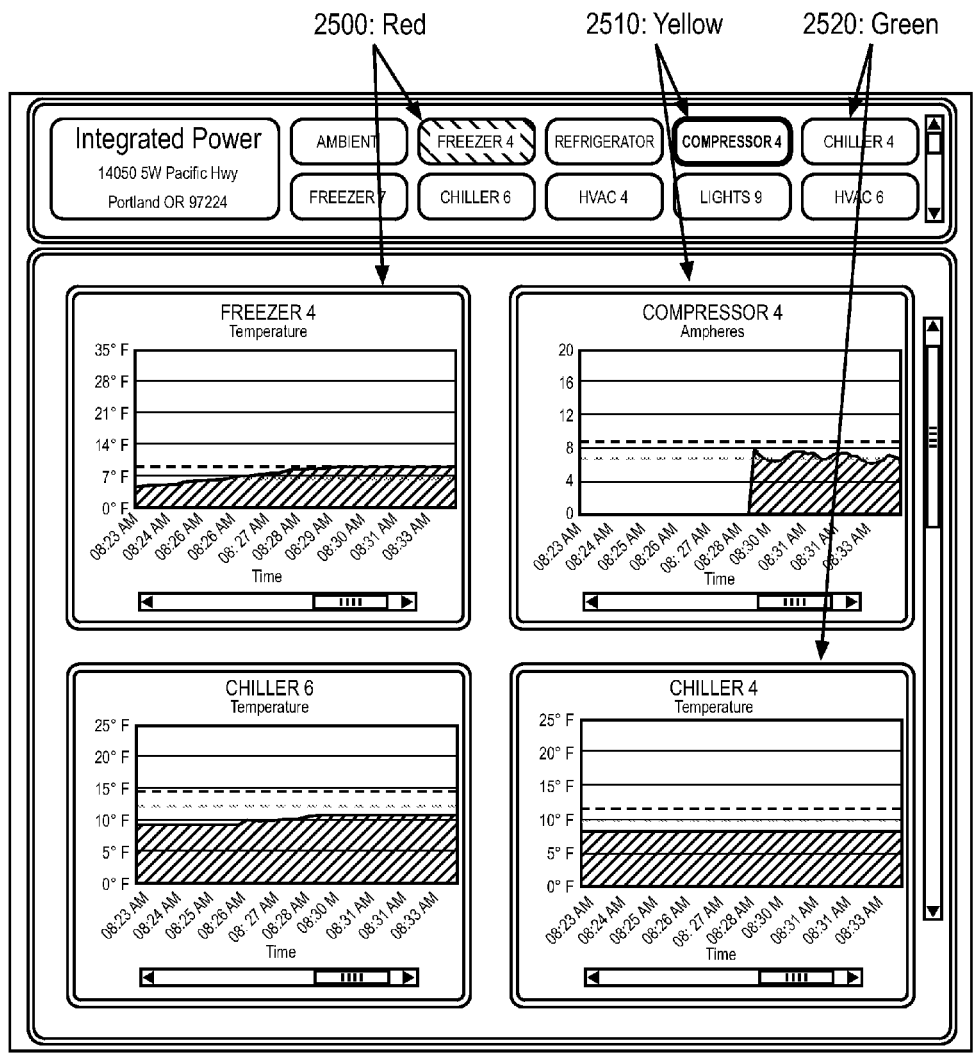
FIG. 25  The Interactive Portal provides 24x7x365 monitoring, alerts and alarms continuously

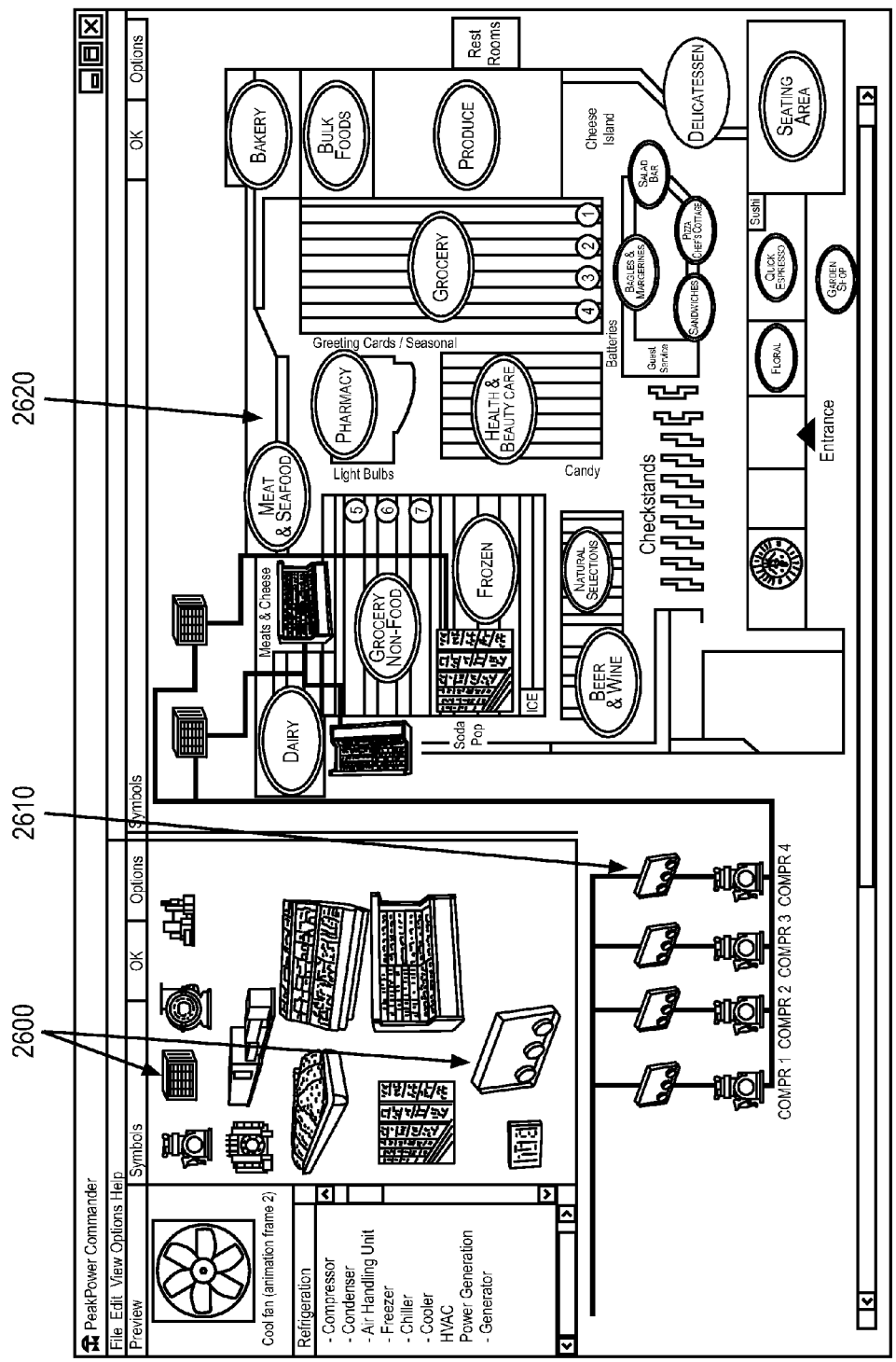
FIG. 26  The PeakPower System Configuration Setup Screen

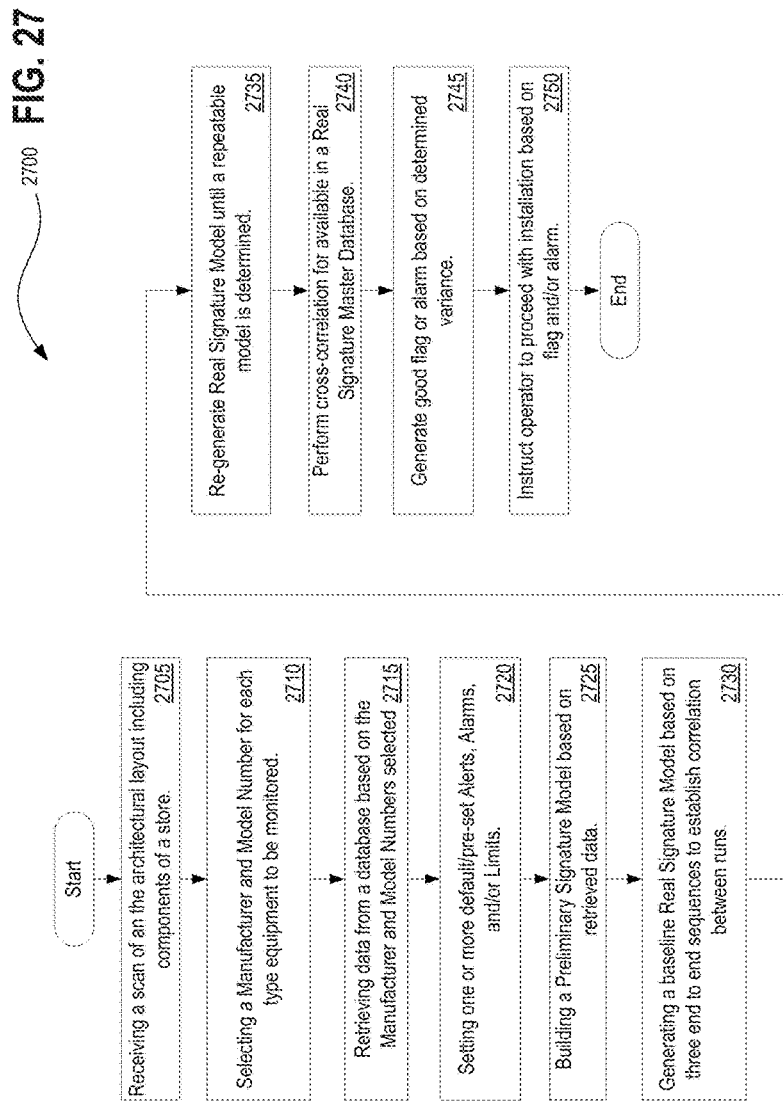

ROLL-LOCK SNAP-ON CURRENT TRANSFORMER

CLAIM OF PRIORITY

This application is related to, and claims priority to, the U.S. provisional utility application entitled "ROLL-LOCK SNAP-ON CURRENT TRANSFORMER," filed on May 21, 2010, having application No. 61/347,184.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

Embodiments of the present invention relate generally to Energy Management and Control Systems (EMCS), and in particular, systems, methods, and apparatuses for implementing a roll-lock snap-on current transformer which operates within or complementary to an energy management and control system.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to disclosed embodiments.

Previously known energy management and control systems are not sufficiently integrated into the fabric of the control panels and wiring at a circuit level.

Previously known energy management and control systems are incapable of sufficient integration inside electrical panels. For example, such systems provide no mechanism by which a monitoring device may clamp on to a wire innocuously with no wires hanging out in order to meet common Fire Marshal requirements for safety. Previously known clamp-on CTs (Current Transformers) installed into a facility and its circuits to characterize energy usage must be removed before the Fire Marshal arrives because such previously known clamp-on CTs result in a "rats nest" of wiring and instrumentation hanging out of the panels or off the wiring in which cannot pass a Fire Marshal inspection, and thus, does not permit permanent on-going usage and installation.

Previously known energy management and control systems lack energy monitoring current transformer based units with algorithms to perform statistical analysis.

The present state of the art may therefore benefit from systems, methods, devices, and apparatuses for implementing a roll-lock snap-on current transformer and associated and complementary PeakPower Energy Management and Control Systems as described herein.

BRIEF SUMMARY OF THE INVENTION

A PeakPower Commander System provides local or remote control of power and other utilities and devices, including security, for commercial, industrial or residential applications. Energy Sensors may plug into a circuit breaker panel with existing Breakers, or snap onto the wiring near a piece of equipment in accordance with various disclosed embodiments set forth below.

BRIEF DESCRIPTION OF THE DRAWINGS

The present invention may be better understood, and its numerous objects, features, and advantages made apparent to those skilled in the art by referencing the accompanying drawings.

FIG. 1A depicts an exemplary Three Phase Circuit Breaker;

FIG. 1B depicts an LFD (Line Fault Detection) Current Limiter;

FIG. 2 depicts PeakPower System Components in accordance with disclosed embodiments;

FIG. 8 depicts how one or more RLSO-CTs may be used for communications over power line(s) in accordance with disclosed embodiments;

FIG. 9 depicts Voltage versus Current Zero Crossings in accordance with disclosed embodiments;

FIG. 10 depicts a Wireless RF Module in accordance with disclosed embodiments;

FIG. 11 depicts a non-preferred implementation of a clamp-on type device;

FIG. 12 depicts an alternative non-preferred implementation of a clamp-on type device;

FIG. 19 depicts a Multi-Stable Relay in accordance with disclosed embodiments;

FIG. 20 depicts a bottom view of a Multi-Stable Relay in accordance with disclosed embodiments;

FIG. 21 depicts a Cutaway view of a Multi-Stable Relay in accordance with disclosed embodiments;

FIG. 22 depicts a graph relative to a PeakPower System in accordance with disclosed embodiments;

FIG. 23 depicts a graph relative to Mean Time Before Failure (MTBF) in accordance with disclosed embodiments;

FIG. 24 depicts a graph relative to a compressor Power-On Signature in accordance with disclosed embodiments;

FIG. 25 depicts an Interactive Portal for monitoring M accordance with disclosed embodiments;

FIG. 26 depicts a PeakPower System Configuration Setup interface in accordance with disclosed embodiments; and FIG. 27 is a flow diagram illustrating a method relative to implementing a roll-lock snap-on current transformer in accordance with disclosed embodiments.

DETAILED DESCRIPTION

Figure 3:
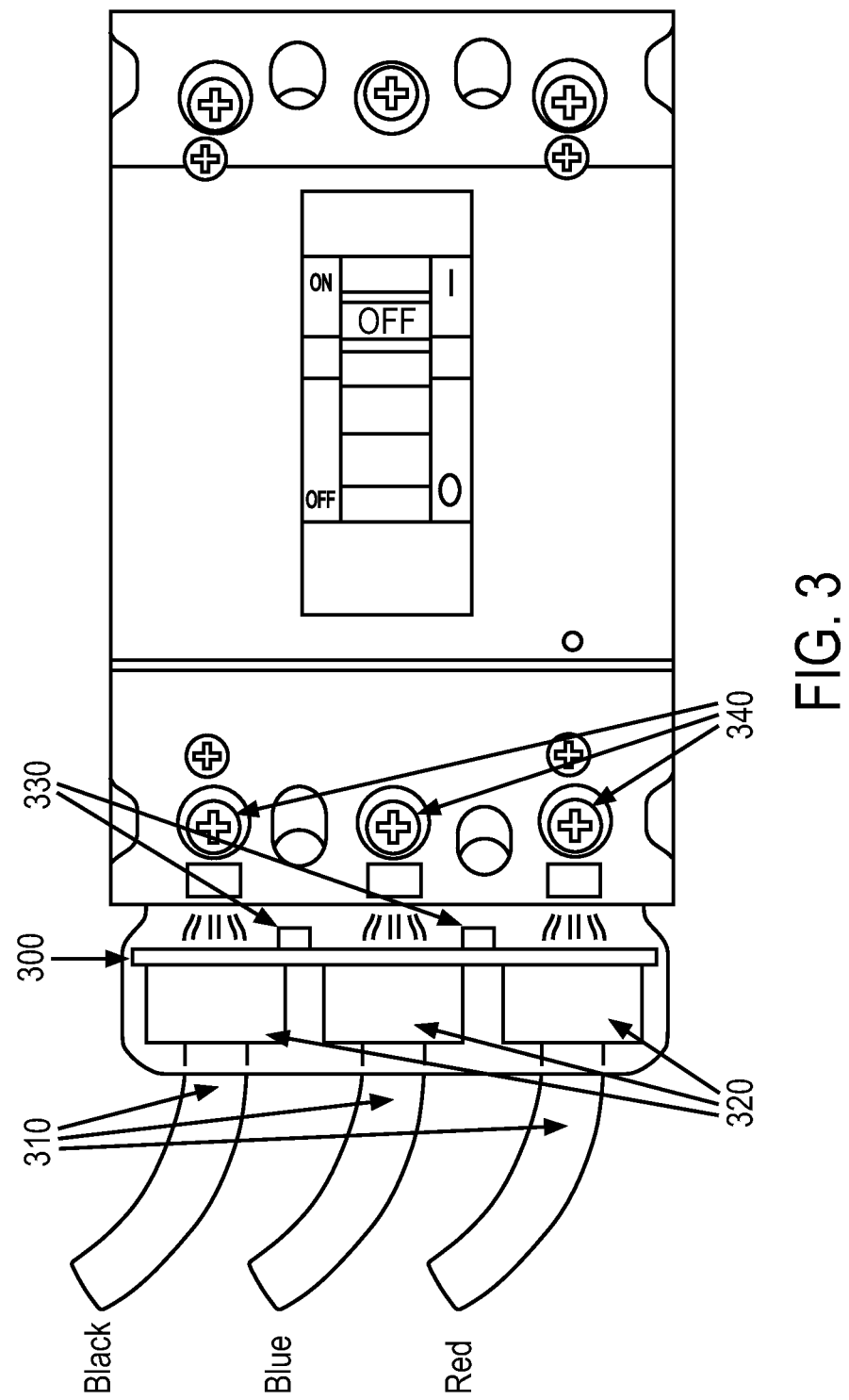
FIG. 3 depicts a three phase PeakPower Commander current sensor module containing three Roll-Lock SnapOn Current Transformers (RLSO-CTs) in accordance with disclosed embodiments.

Described herein are systems, devices, methods, and apparatuses for implementing a roll-lock snap-on current transformer and associated and complementary PeakPower Energy Management and Control Systems.

In a particular embodiment, a PeakPower Energy Management and Control System has one or more roll-lock snap-on current transformer power monitoring devices, each to avoid interrupting power when installing current and/or power monitors. Each roll-lock snap-on current transformer power monitoring device may be snapped onto existing power wires inside a power panel or near equipment being monitored without disconnecting any wires or turning off power. Each roll-lock snap-on current transformer power monitoring device may be utilized in standalone mode as well as within a PeakPower Energy Management and Control System in accordance with disclosed embodiments. Each roll-lock snap-on current transformer power monitoring device may communicate via the power lines (via a Power Line Controller ("PLC")) or communicate via wireless using an integrated microprocessor based RF transceiver.

The disclosed embodiments enable analysis which is not available within previously known power management and monitoring mechanisms. For instance, the disclosed embodiments enable Least Mean Squares best fits, first and second derivatives, power spectral densities, autocorrelations, cross correlations, probability density functions. The disclosed embodiments enable first and second derivatives and use of historical graphs and graphs of similar equipment to anticipate equipment abnormalities and potential failures as well as comparing the energy consumption patterns of a piece of equipment at one location to the same or similar type of equipment at another location.

Through the practice of the disclosed embodiments, it is not necessary to interrupt power and there are no screws to loosen or tighten. In one embodiment, a small Linux based system (e.g., a PeakPower Gateway collects all the data on-site at each building and forwards it to a main server(s) at a Data Center.

In one embodiment, a PeakPower Commander System is closed-loop. It not only senses and analyzes the energy and utilities, it also provides closed loop control, for example, it will monitor temperature, reset a thermostat or turn on/off an air conditioning unit, parking lot lights, etc. locally or remotely and it is Plug-n-Play for simplicity.

In one embodiment, parts of a PeakPower System include, for example:

1) The PeakPower Server with its real-time acquisition/ analysis software and adaptive algorithms is the highest level where data is gathered, processed, analyzed, and the results are sent to clients.
2) The PeakPower Gateway is the intermediate level, gathering all data in one building and forwarding it to server.
3) Sensors and closed-loop controls including:
    a. The PeakPower Wired and/or Wireless Roll-Lock SnapOn Current Transformer based Energy Sensor monitors;
    b. The PeakPower Wireless Temperature/Pressure/Humidity Sensors;
    c. The PeakPower Wired or Wireless Water Flow Sensors;
    d. The PeakPower Wired or Wireless Gas Flow Sensors;
    e. The PeakPower Wireless Thermostat Controllers; and
    f. The PeakPower Wired or Wireless Zero Energy Multi-Stable Relay Controller.

Items a thru d in the list above are Sensors and items e and f are Controllers. However, a relay may also control a solenoid valve to shut-off water, refrigerants or other liquids if there is a leak or if something is left on at an odd time that doesn't correlate well with the normal usage pattern. In one embodiment, the system is continually gathering and cataloging data into its knowledgebase.

Note that reference to the term "PeakPower" is short for a power monitoring system enabled via the disclosed embodiments set forth herein, or a reference to components of the PeakPower system, enabled by the disclosed embodiments, such as components of a power monitoring system which are disclosed herein and may be used in conjunction with a power monitoring system. Some components, such as the roll-lock snap-on current transformer power monitoring device disclosed herein may be used in conjunction with a PeakPower system as disclosed, used with other power monitoring systems, or used in a stand-alone mode, absent a power monitoring system of any kind.

In one embodiment, the PeakPower system and all these sensors/controllers are local area networked to a Gateway node which is connected through the Internet on a Wide Area Network, through a firewall.

In one embodiment, the PeakPower System saves a large amount of energy by peak flattening. Certain hours of the day, the electric companies experience Peak Demand and they charge commercial customers based on that peak usage. In one embodiment, the PeakPower System gleans these peak hours from the web, then it pre-cools all freezers, chillers, coolers, HVACs etc, prior to the peak times (such as just prior to, or at a time sufficient to enable energy used to cool to a determined threshold to be expended during the non-peak time), to minimize energy usage during peak times. In one embodiment, it also re-schedules defrost cycles for peak usage times to minimize or flatten the peak usage. PeakPower software tracks peak hours based on the location of each installation.

In one embodiment, the PeakPower monitoring and controlling software is adaptive insomuch as it extracts the unique signature of each piece of equipment real-time and correlates it with its historical signatures as well as the normal signature and specifications from the manufacturer, which the PeakPower software periodically gleans from the web. In one embodiment, it also correlates it to signatures on similar pieces of equipment and derives variances.

In one embodiment, the PeakPower System maintains a knowledge base of all similar equipment and it can predict failures by even subtle changes in the signatures. It can determine if there is a refrigerator door is open. It can determine if something is going wrong in a piece of equipment and it sends an alert or alarm quickly to a designated person so they can take action or sign onto the portal to see the magnitude of any issues.

In one embodiment, the PeakPower System has an interactive portal which may be used on a Smartphone, Tablet, PC, Pad or other computing devices for delivering local and/or remote monitoring and alerts/alarms 24×7 of an entire building. It has an online dashboard. Alert/Alarm messages may be sent to anyone designated. They receive the alert/alarm message via email, text, and/or voice. The designee may then logon to the interactive portal and examine on a very detailed basis, the data for each piece of equipment. They have access to that data on a password-protected basis to look at each piece of equipment, the whole building of equipment, an entire chain of buildings or around the world for Multi-National Companies.

Over time, as the PeakPower knowledge Base grows larger, the PeakPower System gets smarter and smarter about all of the diversity of equipment, in buildings around the world in accordance with the disclosed embodiments.

Applicants have recognized an unfulfilled need for an Energy Monitoring Current Transformer that fits cleanly either inside the Circuit Breaker Panel or on the wiring near the equipment being monitored to report energy usage without additional wires (i.e. it uses Wireless, RF and/or PLC) so that wires, pig-tails, and leads do not extend from the Energy Monitoring Current Transformer, so as to comply with local code and Fire Marshall safety requirements.

Practice of the disclosed embodiments may provide a highly integrated, innocuous (almost invisible) energy management and control system hardware/software/system, which may be monitored and controlled over the Internet from virtually anywhere in the world.

Practice of the disclosed embodiments may provide virtually continuous, monitoring and analysis of energy consuming equipment and detect early warning signs of increasing energy use or potential failure.

Practice of the disclosed embodiments may provide actively remotely controlled energy usage and thermostats via the internet, (e.g. in case someone leaves an Air Conditioner on after hours, you may receive an SMS message to override it, which you may enter the secure command to override it remotely).

Practice of the disclosed embodiments may fulfill the need for an Energy Monitoring Current Transformer that fits cleanly either inside the Circuit Breaker Panel or on wiring near the equipment being monitored to report energy usage without additional wires whilst simultaneously meeting required Fire Marshall safety requirements or other requirements as established by local code no wires or pig-tails hanging from a monitoring device coupled with a power wire to be monitored).

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Embodiments also relate to a system and/or apparatus for performing the operations disclosed herein. This apparatus may be specially constructed for the required purposes, or it may be a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, embodiments are not described with reference to any particular programming language. It will be appreciated that a variety of programming languages may be used to implement the teachings of the embodiments as described herein.

Embodiments may be provided as a computer program product, or software, that may include a machine-readable medium having stored thereon instructions, which may be used to program a computer system (or other electronic devices) to perform a process according to the disclosed embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine e.g., computer) readable transmission medium (electrical, optical, acoustical), etc.

Any of the disclosed embodiments may be used atone or together with one another in any combination. Although various embodiments may have been partially motivated by deficiencies with conventional techniques and approaches, some of which are described or alluded to within the specification. The embodiments need not necessarily address or solve any of these deficiencies, but rather, may address only some of the deficiencies, address none of the deficiencies, or be directed toward different deficiencies and problems where are not directly discussed.

FIG. 1A depicts an exemplary Three Phase Circuit Breaker and FIG. 1B depicts an LFD Current Limiter. FIGS. 1*a* and 1*b* are prior art images in which the LFD Current Limiter, 100 is a Standard sized 3 Pole Circuit Breaker for 3 Phase Power, 110 is an LFD Current Limiter which connects to the output side of the Breaker.

FIG. 2 depicts PeakPower System Components in accordance with disclosed embodiments. The PeakPower System Components illustrates the components of the system including the PeakPower Central Server, PeakPower Gateway Cellular WAN Module, PeakPower Commander Device, Temperature-Pressure-Humidity Sensor, Gas Sensor, Liquid Sensor, Wireless Thermostat, Operational Software and various user terminals (Laptop, tablet, Cell Phone, etc.). 200 is a PeakPower Commander in a clear enclosure, 210 is a Standard off-the-shelf 3-Phase Circuit Breaker, 220 is a PeakPower Gateway Cellular WAN Module, 230 is a PeakPower Main Server, 240 is the PeakPower Software, Firmware, Manuals and Specifications on a CD, 250 are Computers, PDAs, Cell Phones, Tablets for Monitoring Local or Remote, 260 is a Sensor gage for Gas Flow usage, it sends data to the Gateway wired or wireless, and uses either battery or AC power 270 is a Sensor gage for Water usage, it sends data to the Gateway wired or wireless, and uses either battery or AC power 280 is a Sensor for Temperature, and/or Pressure & Humidity, it sends data to the Gateway wired or wireless, and uses either battery or AC power 290 is a Wireless Thermostat. It receives Commands & sends status via the Gateway over the Internet to the Server. It may use either battery or AC power.

The PeakPower Management and Control System may be organized as a hierarchical system. It is comprised of a Central Server at the top which manages and controls several Gateways at several different locations.

FIG. 2 illustrates a single PeakPower System for a Power Monitoring application. The Data Center contains many Web Edge Servers and Back End Processing/Analysis Servers.

A single pair of Web/Back End Servers can manage and control over 100 buildings. FIG. 2 is a high level diagram of components, elements, and pieces for Power Monitoring and Control and Gas and Water Monitoring. The wireless digital valves for water and gas controls are not shown. The PeakPower System includes a Gateway device at each location to gather and manage the data at that site and it forwards that data up to the main server(s) for further processing, analysis and closed loop control. This diagram includes most of the monitoring and control devices in a PeakPower System: (e.g. RLSO-CT based Current Sensors, Temperature Sensors, Pressure Sensors, Humidity Sensors, Gas Flow Sensors, Liquid Flow Sensors, Thermostats, Multi-Stable Relays each a clamp-on type sensor, probe, or shunt, capable of detecting waveforms). Please refer to FIG. 2 for details. This diagram illustrates how some pieces of the system fit together and communicate in a power monitoring application.

Note that equipment power usage characteristics and curves on a piece of equipment in Location 1 may be analyzed and correlated with the patterns observed on the same type equipment in Location 2 or Location n and adjusted for environmental conditions, to determine if it is outside an adaptively determined corridor of operation. If so, an ALERT or an ALARM will be set dependent on how far outside limits it is or how rapidly (derivative) it is proceeding to go out of limits. Very subtle deviations in trends are detected and reported, before they become an emergency.

The PeakPower Management and Control Apparatus that includes sensors, relays, acquisition, processing and analysis software and operational user interface. The sensors monitor power in the power lines, they also derive all the power to drive the monitor module apparatus from the power lines they are monitoring. These modules also communicate over power lines all without making physical contact with said power lines.

The Power Management and Control Software 240 performs statistical analysis on all signals including least mean squares, first and second derivatives, FFTs auto and cross correlations, modal analyses and uses a large library of algorithms to analyze data acquired in real-time versus historical data as well as correlating it with manufacturers specs as well as data from the same model of equipment in other locations to detect early warning signs of potential failures or anomalies in the power used by this equipment versus other same or similar equipment in order to optimize energy use and all but eliminate emergencies.

The Power Management and Control User Interface are shown replicated on the Computer, Cell Phone and PDA in 250 uses a priority pop-up scheme to pop-up the most critical alert or alarm item out of the group currently being monitored to bring instant attention to it (Border and corresponding "Idiot Light" colored Red is a Critical ALARM) (Border and corresponding "Idiot Light" colored Yellow is a warning ALERT) (Border and corresponding "Idiot Light" colored Green means it is within limits). The PeakPower System gives the operator timely data to make critical decisions instantly. There is a set of Red, Yellow, and Green indicators (like idiot lights) across the top (or bottom) of the screen where the overall status of all entities being monitors is viewable at a glance. The Red ones always bubble up toward the top of the screen toward the upper left corner and simultaneously sound the buzzer.

If multiple ALARMS occur the second one bubbles to the right upper corner then the tower left corner then finally the lower right corner if four alarms occur before they can be corrected and reset to green status. After the screen is full, the idiot lights at the top are used to manage further red and yellow ALARMS and ALERTS. As the ALERTS come back within range they automatically turn Green, however an ALARM should be corrected back into normal range, then the operator clicks on the corresponding Idiot Light to RESET it to GREEN.

Embodiments of the present disclosure describe a PeakPower System, which includes the Peak Power Commander Sensor Module. The Peak Power System provides local and/or remote control of various aspects of device operation (e.g., power, security, etc.) for commercial, industrial and/or residential applications. In some embodiments, the Peak Power System may monitor temperature and reset a thermostat, and turn an air conditioning or refrigeration unit on or off remotely.

The present disclosure implements the Peak Power System's energy sensor through a PeakPower Commander device that may be coupled, e.g., installed, beside a conventional circuit breaker such as, but not limited to, an Eaton (Cutler-Hammer) ED and FD type of circuit breaker, see, e.g. FIG. 1*a*. In other embodiments, the PeakPower Commander may be configured to couple with other circuit breakers. The Multi-Stable Relay version of the PeakPower Commander having a similar form factor to the LFD Current Limiter shown in FIG. 1*b* yet embodying enhancements which are disclosed herein. Whereas the RLSO version of the PeakPower COMMANDER requires no physical connection to any of the wires, (the wires pass directly through the We(s) in the PeakPower COMMANDER (insulation and all in many cases) with no screws, because the wire is not fixedly attached (e.g., with screws) to the PeakPower COMMANDER.

The RLSO-CT based PeakPower COMMANDER may have one, two, three or more phases and they simply snap onto the wires. See FIGS. 3, 4 and 5. There is no electrical connection or physical connection required. The sensing and communications are all done via the Roll-Lock SnapON current Transformers (RLSO-CTs). The power to drive the PeakPower COMMANDER is extracted through these same RLSO-CTs (see FIG. 6).

The PeakPower COMMANDER may communicate through the wires it is monitoring or it may communicate through the RF wireless module (Sub-Gigahertz and up) that simply plugs into the rear of the main board in this embodiment. See FIGS. 7 and 8. In other embodiments, it is integrated into the main PCB (see FIG. 10). Note, this RF wireless module has an optional stuffing space to plug in the temperature and humidity sensors so that the same module can be used for any one or all three of the Temperature/Pressure/Humidity sensors, simply by connecting a battery to it and placing it in an enclosure.

The pressure sensor in this embodiment is a Pegasus MPL115A MEMS type sensor (very tiny).

FIG. 3 depicts a three phase PeakPower Commander current sensor module containing three Roll-Lock Snap-On CTs in accordance with disclosed embodiments. FIG. 3 is an exemplary embodiment of the three phase PeakPower Commander current sensor module containing three Roll-Lock Snap-On CTs, installed adjacent to a circuit breaker, 300 is a PeakPower Commander Printed Circuit Board (PCB), 310 illustrates the Three Phase Power Wires going straight through, insulation and all. Contact is not required. 320 illustrates the Three RLSO-CTs (one for each Phase of power), 330 shows Capacitors mounted on one side of the Printed Circuit Board. It is not necessary to remove any of these screws 340 during installation of RLSO-CT Unit.

Referring to FIG. 3, in this embodiment, there are three RLSO-CTs mounted on the Printed Circuit Board (PCB) in a row. The RLSO CT allows the PeakPower Commander Energy Monitor to simply SnapOn the wires without disconnecting anything from the breaker or the equipment it supplies, and also negating the need to remove the screws 340.

Figure 4:
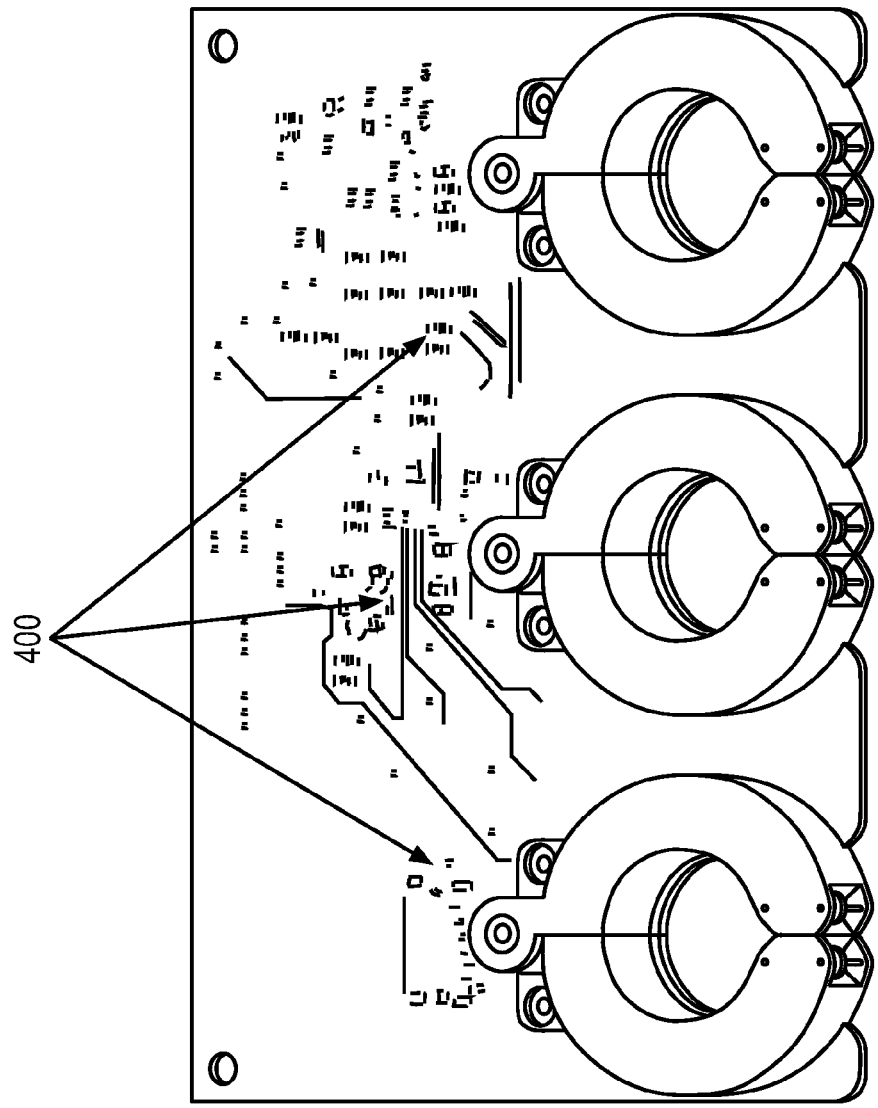
FIG. 4 depicts a PeakPower Commander Module Front View with three RLSO-CTs in accordance with disclosed embodiments.

FIG. 4 depicts a PeakPower Commander Module Front View with three RLSO-CTs in accordance with disclosed embodiments. The PeakPower Commander Module Front View with three RLSO-CTs 400 Image, PeakPower Commander Front View, shows the components and CTs.

With reference back to FIG. 3 and also to FIG. 4; A perspective view of a circuit breaker with the PeakPower COMMANDER coupled thereto in accordance with some embodiments. The housing of the PeakPower COMMANDER is shown as semitransparent in FIG. 3 and the housing is removed in FIG. 4.

Figure 7:
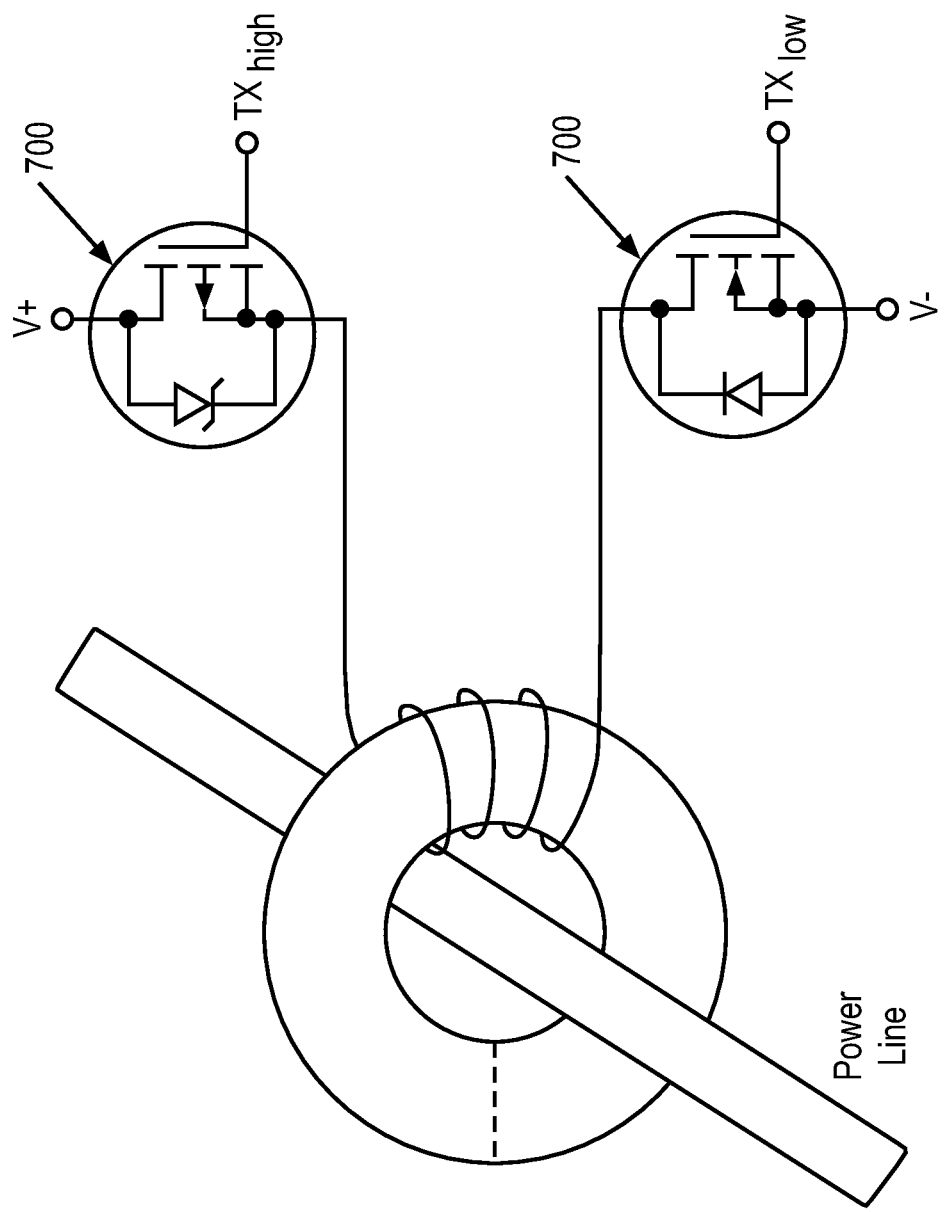
FIG. 7 depicts how one or more CTs may be used for communications over power line(s) in accordance with disclosed embodiments.

One element of the PeakPower COMMANDER is the communications methodology. The PeakPower COMMANDER utilizes the RLSO-CTs for communications, obviating the need for physically connecting to the wire(s); Refer also to FIGS. 7 and 8.

Using such a technique, the current and voltage on the Wire(s) is 90 degrees out of phase. Refer also to FIG. 9 for an illustration of this relationship. Using other techniques (e.g. X-10), the communications must occur at or near the Voltage zero crossing when the voltage in the line is at a low ebb. The presently disclosed PeakPower COMMANDER, however, is more flexible. Since it utilizes a Current Transformer to communicate, it can also transmit and receive when the Line Voltage is at or near its MAXIMUM, because that is when the Current is near zero. The PeakPower COMMANDER typically sends or receives high frequency pulses during a preset narrow window of time relative to a cycle (typically 50 Hz or 60 Hz). Also, the position of the pulse(s) within this window may be further interpreted to yield even more data bits per cycle.

The liquid and gas flowmeters in the preferred embodiment (FIG. 2) may use Doppler technology, or Magnetic-Inductive or Coriolis type sensor pickups. The small wall-wart attached to it contains the RE wireless module and is capable to receive info from nearby monitors (e.g., such as those having a transceiver as disclosed herein) and then to forward received information to a central collection location, gateway, node, etc.

The RLSO-CTs can optionally communicate in Power Line Controller (PLC) mode. The RLSO-CTs are modulated with a high voltage signal to send data over the power lines using non-contact induction. There are very sensitive tuned receiver circuits and signal processing firmware to receive the signals from the power lines.

Figure 5:
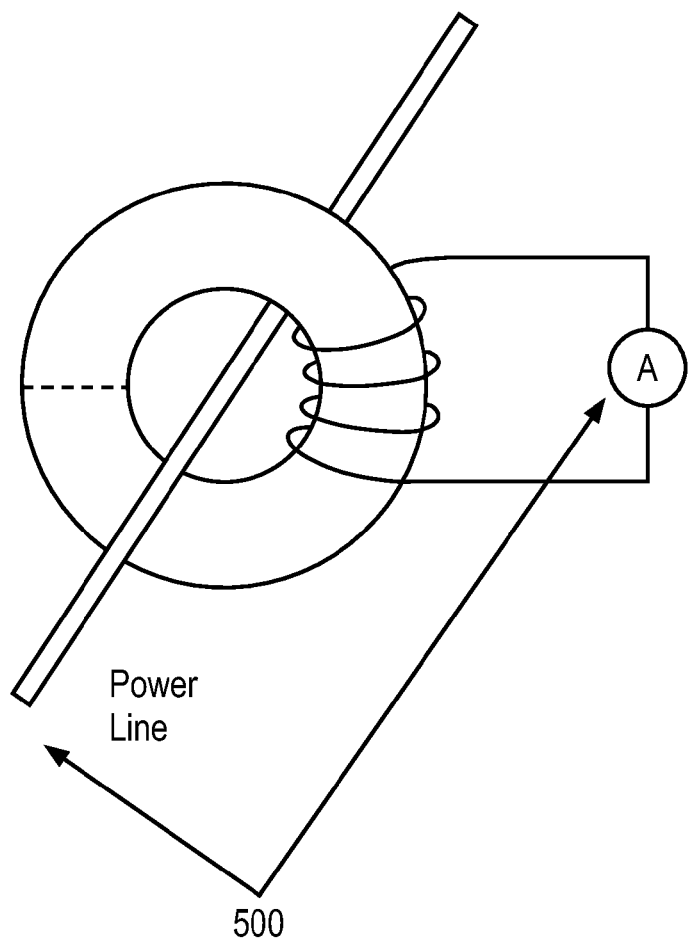
FIG. 5 depicts a Roil-Lock SnapOn Current Transformer (RLSO-CT) used as a current measuring device to sense Current in accordance with disclosed embodiments.

FIG. 5 depicts a Roll-Lock SnapOn Current Transformer used as a current measuring device to sense Current in accordance with disclosed embodiments. The Roll-Lock SnapOn Current Transformer used as a current measuring device Co sense Current. 500 Senses current flowing through the power line.

Figure 6:
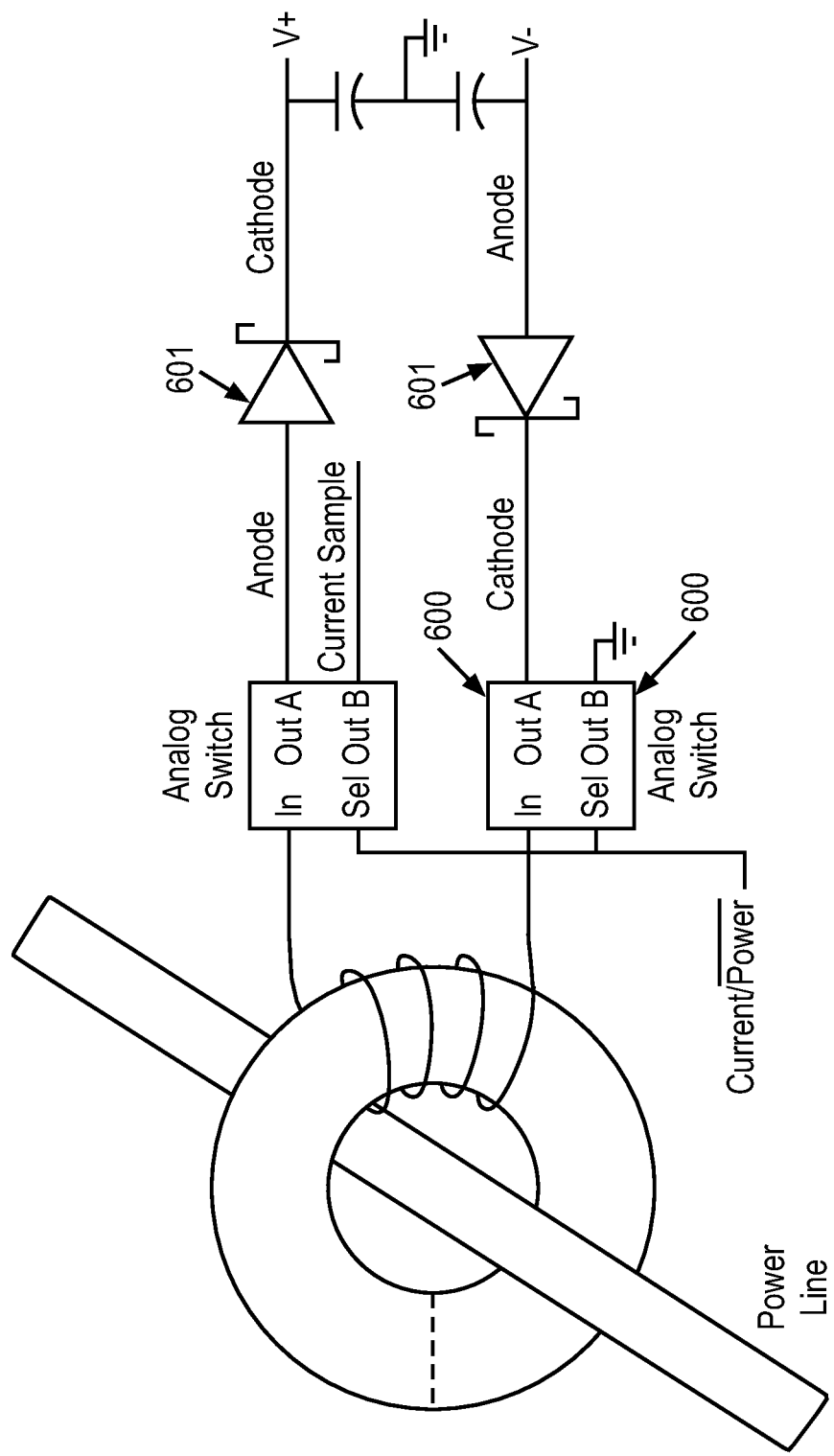
FIG. 6 depicts a RLSO-CT used to extract power during the intervals when it is not measuring in accordance with disclosed embodiments.

FIG. 6 depicts a RLS-CT is used to extract power during the intervals when it is not measuring in accordance with disclosed embodiments. The RLS-CT is used to extract power during the intervals when it is not measuring, so that it supplies power to the PeakPower Commander Device, 600 The Analog Switches switch the Roll-Lock SnapOn Current Transformer between sampling current and supplying power to the PeakPower Commander module 601. The Roll-Lock SnapOn Current Transformer supplies power to the PeakPower using Schottky Diodes or a Schottky Full Wave Bridge, Commander Module, during periods when the current is not being sampled which may vary, e.g. 15 sec., 30 sec, etc.

FIG. 6 illustrates how the PeakPower COMMANDER is powered by the RLSO-CTs in accordance with some embodiments. This shows how the CTs are wave rectified (when they are not being sampled) in order to extract power to power the device. They normally sample once every 15 to 30 seconds for only a few milliseconds, so they supply power most of the time.

Disclosed embodiments solve problems of prior art relays. The Multi-Stable Relay consumes much less (near zero) energy. Only a minimal amount of energy (a pulse) changes the relay from one state to another.

The Power Management and Control days in FIGS. 19, 20 and 21 require zero electrical energy to remain in an enabled or disabled state, referred to as a Permanent Magnet Multipole, Multi-Throw Relay that has a magnetic detent at every throw position requiring no electrical energy to be applied to keep it closed or to keep it open as the case may be.

The RLSO-CT power monitoring device monitors power in the power lines, without having to interrupt electricity to the power lines to install it. These devices also communicate over the power lines without requiring physical contact with the power lines. These devices also communication via RF wireless as well.

Using the disclosed device avoids interrupting power when installing a device to monitor current or power. This device may be simply snapped onto existing power wires inside the power panel or near the piece of equipment being monitored without disconnecting any wires or turning off power. It may be used standalone or it may include a highly integrated microprocessor based transceiver in the sub-GHz range or even in the 802.11 ranges, 2.4 GHz and up (see FIG. 10).

The embedded Power Management Software/Firmware performs statistical analysis on all signals including Least Mean Squares best fits, first and second derivatives, power spectral densities, auto correlations, cross correlations, probability density functions and utilize historical analyses and graphs and graphs of similar equipment to analyze trends and anticipate equipment abnormalities and predict potential equipment failures long before they occur. This Adaptive Software/Firmware uses the manufacturer's specs gleaned from the Internet as a baseline for setting limits of operation, but it also monitors the daily limits of operation of the actual piece of equipment to derive the actual character and signatures. It performs trends analysis and limits checking to determine if the circuit is within normal operational parameters. The software also cross correlates current data to manufacturers specs as well as data from the same model of equipment in other locations to detect early warning signs of potential failures or anomalies in the power used by this equipment versus the same or other similar equipment in order to continually optimize energy use under a multitude of ambient conditions.

Embodiments of the present disclosure may monitor commercial, industrial and/or residential applications.

FIG. 7 depicts how one or more Cis may be used for communications over power line(s) in accordance with disclosed embodiment. One or more of the CTs may be used for communications over the power line(s). This figure illustrates the Transmit mode. 700 One or more of the CTs may be switched (Using very low $R_{Ds}$ ON FETs) to use it as a Communications device for transmitting and receiving. This is one implementation for the Transmit side of the PeakPower Commander Board.

FIG. 8 depicts how one or more of the RLSO-CTs may be used for communications over power line(s) accordance with disclosed embodiments. One or more of the RLSO-CTs may be used for communications over the power line(s), figure illustrates the Receive mode 800. One or more of the RLSO-CTs may be switched (Using very low $R_{DS}$ ON FETs) to use it as a Communications device for transmitting and receiving. This is one implementation for the Receive side of the PeakPower Commander Board showing the first stage of a receive filter.

FIG. 9 depicts Voltage versus Current Zero Crossings in accordance with disclosed embodiments. Voltage versus Current Zero Crossings, showing how the PeakPower commander communicates near zero crossings using the same RLSO-CT that it measures current with 900. Zero crossing for Voltage and Current are 180 degrees out of phase.

FIG. 10 depicts a Wireless RF Module in accordance with disclosed embodiments. For example, the Wireless RF Module using ~433 MHz, ~900 MHz, ~2.4 GHz., etc.

FIG. 11 depicts a non-preferred implementation of a clamp-on type device. FIG. 11 is a prior art image of an existing clamp-on type device which would be very difficult if not impossible to get three of them to fit side by side to monitor current going through a 3 phase circuit breaker. This device also require wires to connect it to a monitoring device. Fire Marshalls and local codes do not allow wires protruding from Circuit Breaker Panels.

FIG. 12 depicts an alternative non-preferred implementation of a clamp-on type device. FIG. 12 is another prior art image of an existing clamp-on type device. It has very long handles with squeeze grips that would be very difficult to install inside the existing Circuit Breaker panels. Also, it would require wires to connect it to a monitoring device, which would violate Fire and Building codes.

Figure 13:
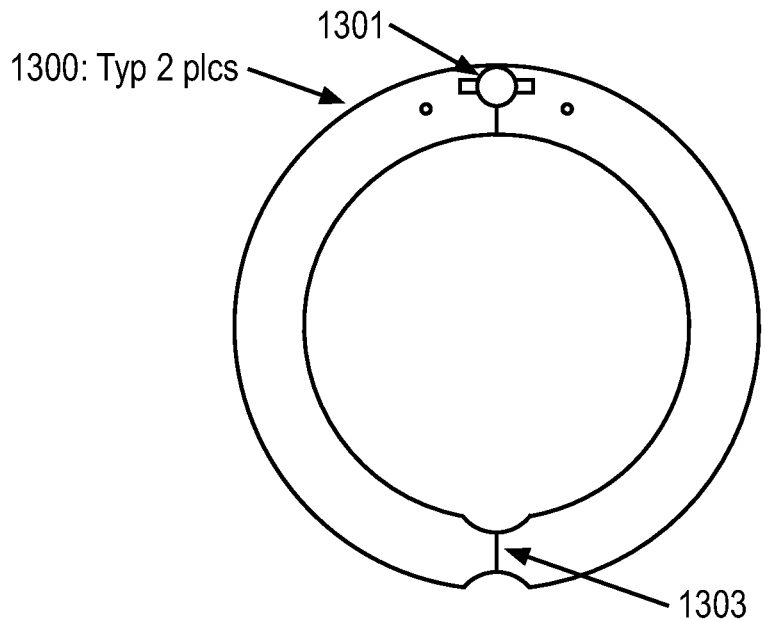
FIG. 13 depicts two semicircular coil-forms hinged at the top in accordance with disclosed embodiments.

FIG. 13 depicts two semicircular coil-forms hinged at the top in accordance with disclosed embodiments. FIG. 13 illustrates one exemplary embodiment which is comprised of two semicircular coil-forms hinged at the top the top with a spring that keeps tension on the two semicircular halves to maintain contact at the bottom. This exemplary embodiment is constructed of a non-rigid, springy type silicon steel, 1300 illustrates two semicircular coil-forms that mate and are spring loaded to the closed position, 1301 is the spring loaded hinge at the top that keeps tension on the two semicircular halves by pressing on the pins 1401 to maintain contact at 1303 (the bottom faces).

Referring still to FIG. 13, this illustrates one exemplary embodiment which is comprised of 1300 two semicircular coil-forms 1301 hinged at the top with a spring 1301 that keeps tension on the two semicircular halves by pressing on the pins 1302 to maintain contact at the bottom faces 1303. The bottom faces 1303 may or may not be recessed in to accommodate the rollers. This drawing shows a recess, but one is not used in some alternative embodiments. This particular embodiment is constructed of a non-rigid, springy type silicon steel, nickel alloys or similar ferromagnetic type material.

Figure 14:
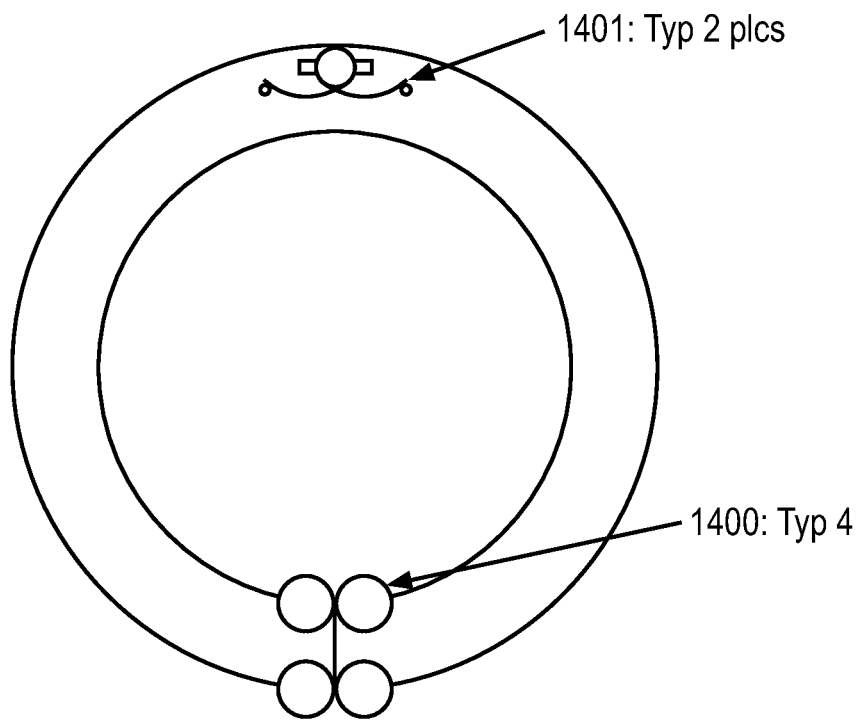
FIG. 14 depicts a double semicircle like coil-form of a Roll-Lock SnapOn Current Transformer (RLSO-CT) in accordance with disclosed embodiments.

FIG. 14 depicts a double semicircle like coil-form of the Roll-Lock Snap-On CT in accordance with disclosed embodiments. FIG. 14 Illustrates the double semicircle like coil-form embodiment of the Roll-Lock Snap-On CT with up to 2000 turns of 40 gage Magnet wire wrapped on it and terminated at the two pins. The Roll-Lock Snap-On CT is optionally encased in a thin coat of plastic or potting compound to seal it for long life and ease of handling. The optional rollers 1400 are illustrated as they appear in this exemplary embodiment. The rollers are not necessary in several of the embodiments. 1400 illustrates the optional rollers. 1401 illustrates the spring and pins used to load the assembly to the closed position.

FIG. 14 Illustrates the double semicircle like coil-form embodiment of the Roll-Lock Snap-On CT with 2000 turns of 40 gage Magnet wire wrapped on it and terminated at the two pins. Said Roll-Lock Snap-On CT is optionally encased in a thin coat of plastic or potting compound to seal it for long life and ease of handling. There are four rollers at the bottom of the Roll-Lock Snap-On CT to facilitate installation and removal of the device(s).

Figure 15:
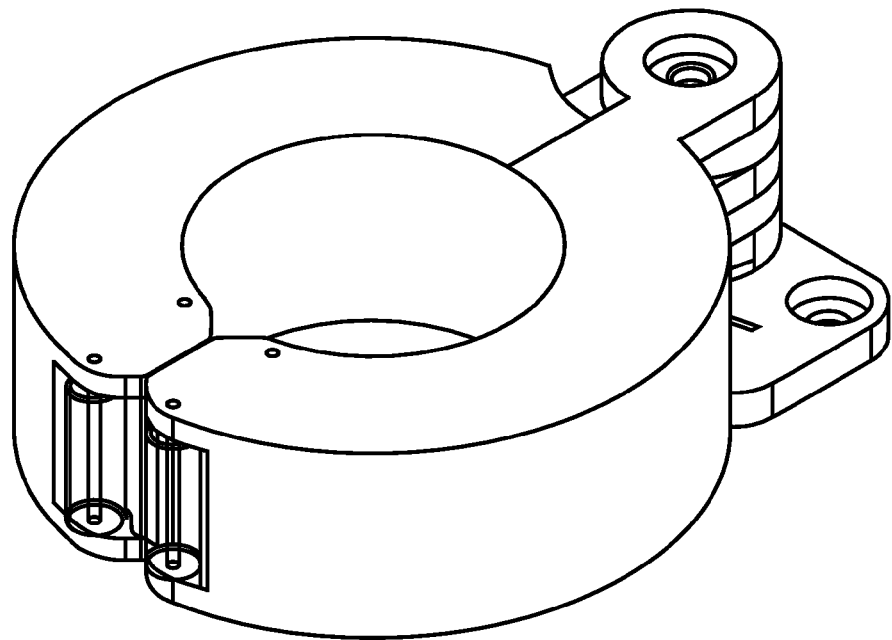
FIG. 15 depicts a three dimensional picture of a Roll-Lock Snap-On Current Transformer in accordance with disclosed embodiments.

FIG. 15 depicts a three dimensional picture of a Roll-Lock Snap-On Current Transformer in accordance with disclosed embodiments. FIG. 15 illustrates a three dimensional picture of the Roll-Lock Snap-On Current Transformer. FIG. 15 Illustrates the PeakPower Roll-Lock Snap-On Current Transformer with the hinge offset from the circle in an exemplary embodiment.

Figure 16:
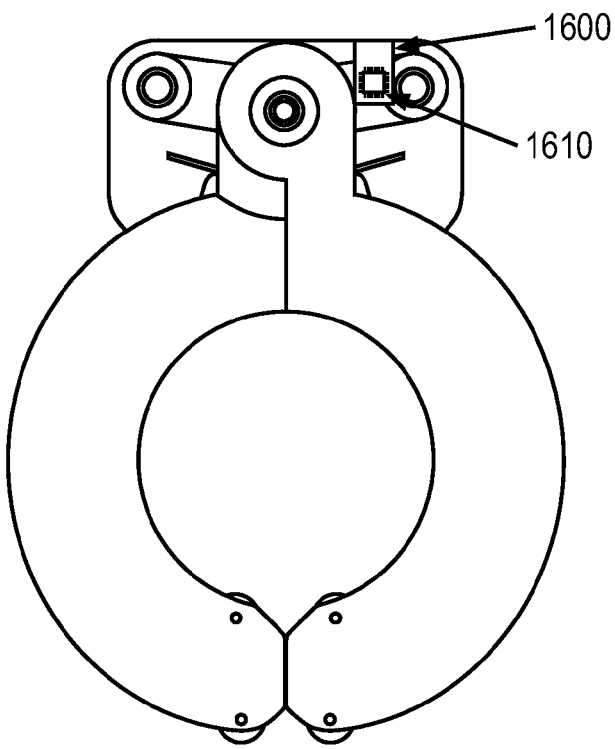
FIG. 16 depicts an alternative view of a Roll-Lock Snap-On Current Transformer in accordance with disclosed embodiments.

FIG. 16 depicts an alternative view of a Roll-Lock Snap-On Current Transformer in accordance with disclosed embodiments. FIG. 16 Illustrates an exemplary embodiment of the Roll-Lock Snap-On Current Transformer complete with the integrated electronics and transceivers for communicating either over the powerline or via RF. The antenna 1600 and VLSI acquisition and communications circuitry 1610 are illustrated as they appear in this exemplary embodiment. These are mounted on a small detachable printed circuit board. They receive power from the power line through the current transformer. It contains a small capacitor for backup, but when there is no power on, it does not transmit.

FIG. 16 illustrates an exemplary embodiment of the PeakPower RLSO-CT complete with electronics snap-on one for a single phase circuit. Note that three of these singles may be snapped on to monitor a three phase circuit. Note that each of the three may communicate individually either over the powerline or via RF, or one may be programmed as a MASTER which collects data from all the others in its panel, then forwards to the Gateway Device.

Figure 17:
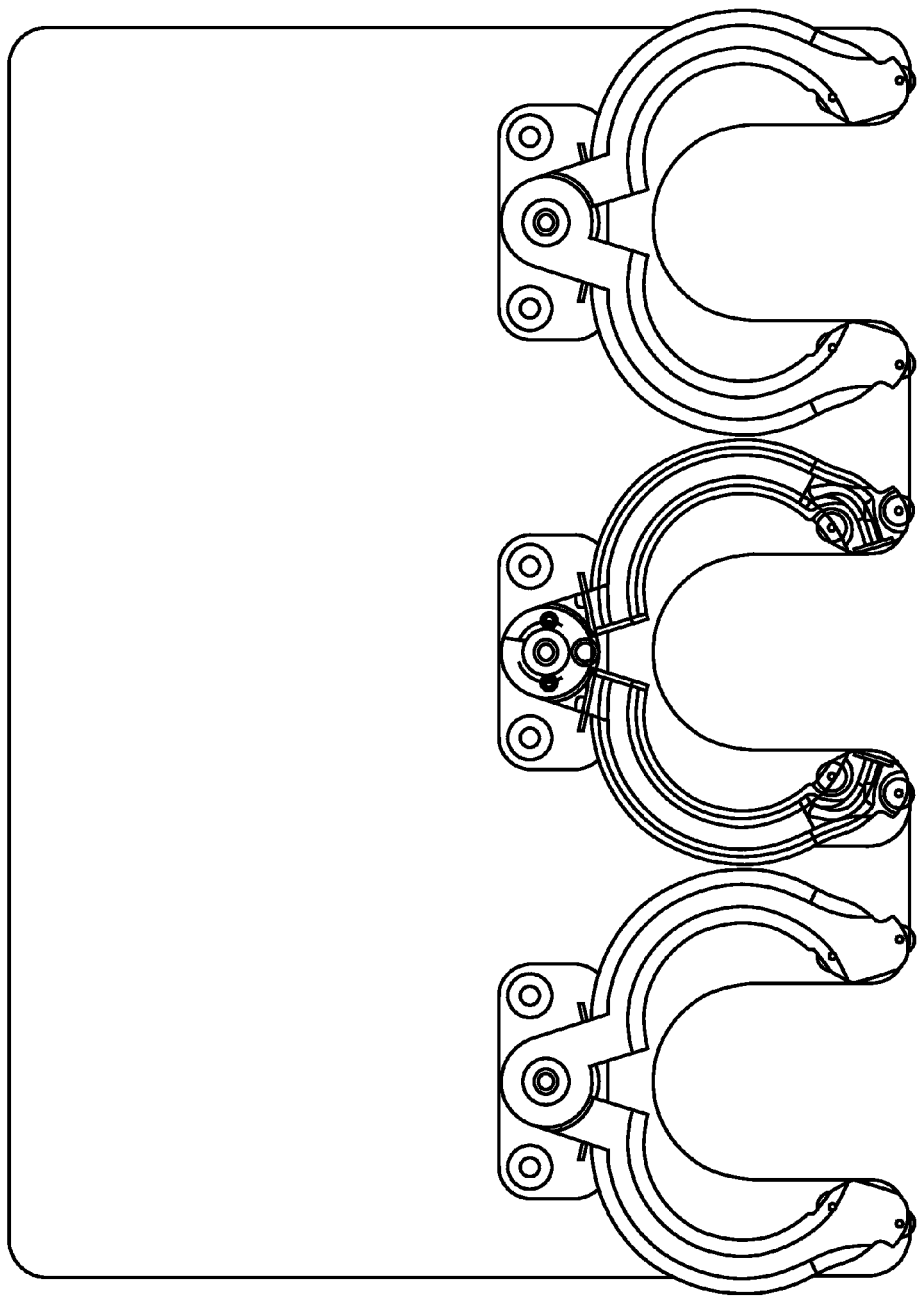
FIG. 17 depicts three Roll-Lock Snap-On Current Transformers are aggregated onto a single Printed Circuit Board (PCB) in accordance with disclosed embodiments.

FIG. 17 depicts three Roll-Lock Snap-On Current Transformers are aggregated onto a single PCB in accordance with disclosed embodiments. FIG. 17 Illustrates an exemplary embodiment where three of the Roll-Lock Snap-On Current Transformers are aggregated onto a single PCB for snapping onto and monitoring a full 3 phase circuit at once. This embodiment also contains the integrated electronics and transceivers for communicating either over the powerline or via RF on the PCB module.

FIG. 17 illustrates another exemplary embodiment showing a three phase current sensor module with three Roll-Lock CTs installed. All 3 CTs may open simultaneously without interfering with adjacent RLSO-CTs.

It contains a super capacitor for backup to rapidly acquire and record the Power-On Signature when it comes back on, but when there is no power on, it does not transmit.

Figure 18:
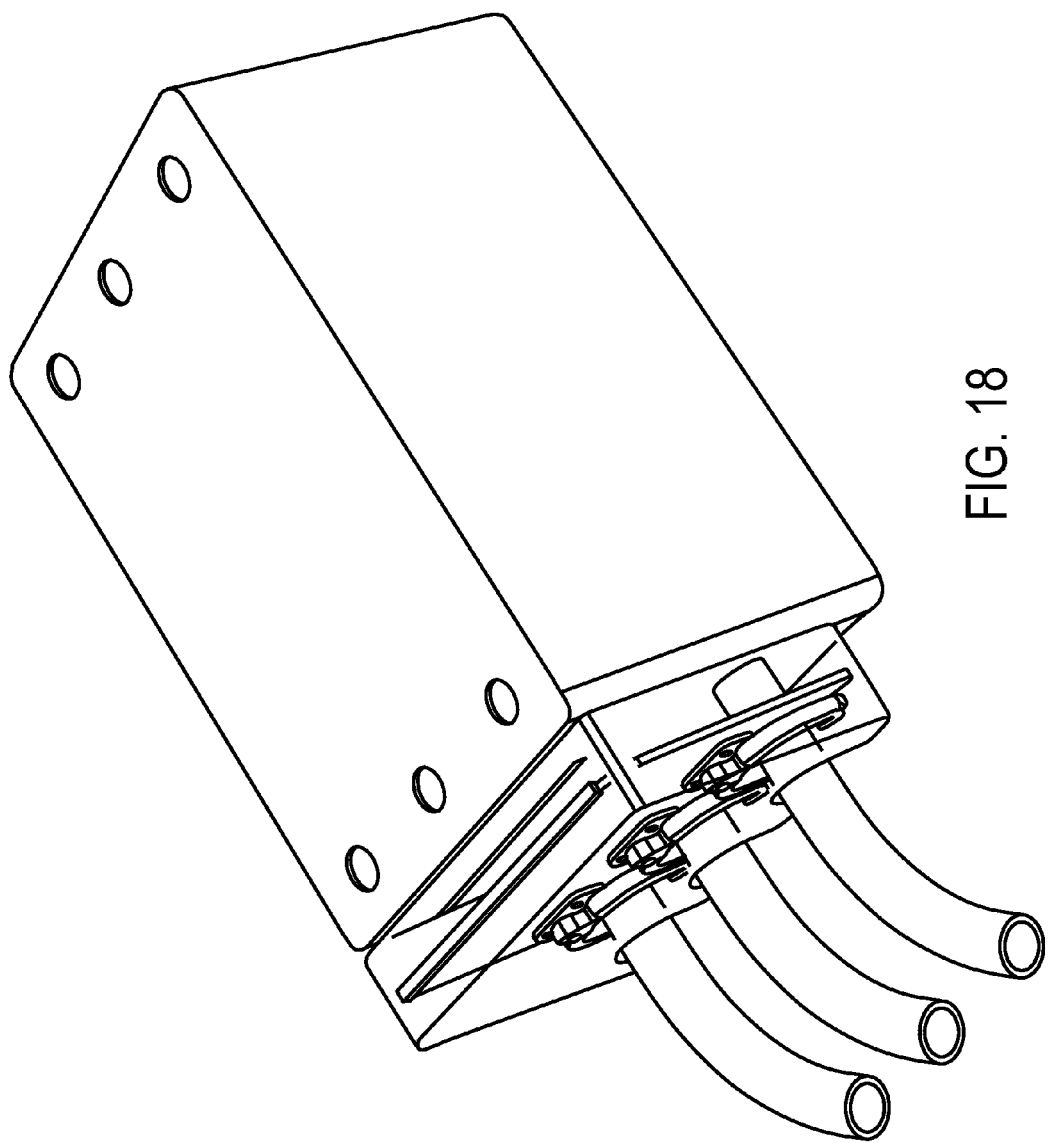
FIG. 18 depicts a 3 phase current sensor module installed adjacent to a circuit breaker having three Roll-Lock Snap-On CTs in accordance with disclosed embodiments.

FIG. 18 depicts a 3 phase current sensor module installed adjacent to a circuit breaker having three Roll-Lock Snap-On CTs in accordance with disclosed embodiments. FIG. 18 illustrates an exemplary embodiment of a 3 phase current sensor module installed adjacent to a circuit breaker containing three Roll-Lock Snap-On CTs.

FIG. 18 shows another exemplary embodiment of the PeakPower Roll-Lock Snap-On Current Transformer containing three complete Roll-Lock Snap-On CT devices mounted on a single PCB with electronic circuitry for monitoring a 3 phase circuit. Note that in this case the data from all three is aggregated and sent back to the gateway over one of the three links.

Each one may be programmed to communicate individually either over the powerline or via RF, or one may be programmed as a MASTER which collects data from all the others on its circuit or in its panel, then forwards the aggregate data to the Gateway which in turn forwards the data to the Main Server at the Data Center.

FIG. 18 Illustrates another exemplary embodiment 3 phase current sensor module installed adjacent to a circuit breaker containing three Roll-Lock Snap-On CTs.

The present disclosure implements these Peak Power Roll-Lock Snap-On Devices inside a power panel and they may be coupled, e.g., installed, beside a conventional circuit breaker such as, but not limited to, an Eaton (Cutler-Ham) ED and FD type of circuit breaker such as that of FIG. 1a. In other embodiments, the PeakPower COMMANDER may be configured to couple with other circuit breakers without screws, because the wire is not fixedly attached (e.g., via screws) in the PeakPower Roll-Lock Snap-On Devices.

One of the Control elements in a PeakPower Energy Management and Control System is referred to as a Multi-Stable Magnetic Relay Multi-stable relay method and apparatus for switching electrical power with zero holding current.

This method and apparatus for switching power, requires no activation or hold current once it is switched to any state. Any detent state is held by permanent magnet force and requires zero current to hold the relay in any detent state position.

FIG. 19 depicts a Multi-Stable Relay in accordance with disclosed embodiments. FIG. 19 Illustrates one embodiment of the Multi-Stable Relay, a Triple Pole Single Throw (TPST) version for three phase. 1900 is a Relay case, (e.g. polycarbonate, ABS, Plastic, etc.), 1910 Relay contact pins, 1920 Embodiment that plugs into a Circuit Breaker (Triple Pole Single Throw).

One Embodiment of the Multi-Stable Relay is illustrated in FIG. 19. This embodiment is a simple form, a Triple Pole Single Throw (TPST) version for three phase.

The enclosure case 1900 is plastic and could be polycarbonate, ABS, acrylic, etc. There are five connector pins 1910 in this embodiment which make electrical contact to the Printed Circuit Board (PCB) usually via a connector socket that is soldered down onto the PCB when it is manufactured.

FIG. 20 depicts a bottom view of a Multi-Stable Relay in accordance with disclosed embodiments. FIG. 20 shows a bottom view of the Multi-Stable Relay showing the five connector, 2000 Main Voltage/Current Input/Output, 2010 Voltage/Current Input/Output-1 NOC-1, 2020+Control. Pulse-2, 2030 Voltage/Current Input/Output-2 NOC-2, 2040+ Control Pulse-1

FIG. 20 is a bottom view of the Multi-Stable Relay showing the five connector pins. These pins are typically fairly large in order to minimize losses when high currents are passing through. The Main Voltage/Current Input/Output Pin 2000 is where the main input current/voltage or output current/voltage either enters or exits. It is bi-directional.

FIG. 21 depicts a Cutaway view of a Multi-Stable Relay in accordance with disclosed embodiments. FIG. 21 Cutaway view of one of the embodiments, 2100 Voltage/Current Input/Output-1 NOC-1 Static Contact, 2110 Voltage/Current Input/Output NOC-1 Osculating Contact, 2120 Reciprocating Magnet(s) Left and Right, 2130 Slightly ferrous material screw or Rivet like slug detent attract and hold Reciprocating magnet(s) Left and Right Counter Polarity Electro-Magnet(s) Left and Right, 2140 Planar support bar, Left and Right, 2150 Left to Right Stiffener support, 2160 Torsion beam electrical conductor Main Voltage/Current Input/Output, 2170 Inductor Coils, Left and Right, 2180 Voltage/Current Input/Output-2 NOC-2 Static Contact, 2190 Voltage/Current Input/Output-2 NOC-2 Osculating Contact.

The Voltage/Current Input/Output Pin-1 2010 is where one input current/voltage or one output current/voltage either enters or exits. This pin is also referred to as NOC-1 which means "Normally Open or Closed." This is to distinguish it from prior art which is either NO (Normally Open) or NC (Normally Closed) as opposed to NOC-1 "Normally Open or Closed." This pin is also bi-directional.

The Voltage/Current Input/Output Pin-2 2030 is where a second input current/voltage or one output current/voltage either enters or exits. This pin is also referred to as NOC-2. This pin is also bi-directional.

The Control Pins, Control Pulse-1 2020 and Control Pulse-2 2040 are where the activation switching signal is applied.

When 2040 is held at Ground potential and a 20 msec 12 Volt pulse is applied to 2020 the Relay goes to STATE 1 where MAIN 2000 is connected to 2010. And it stays in that state consuming no detention until an opposite polarity pulse is received, e.g., when 2020 is held at Ground potential and a 20 msec 12 Volt pulse is applied to 240 the Relay goes to STATE 2 where MAIN 2000 is connected to 2030. It stays in that state consuming no detention power until an opposite polarity pulse is received.

Referring back to FIG. 3 and also to FIGS. 19, 20 and 21; In order to move the torsion beam conductor 2170 over to the left side and activate current flow between pins 2000 and 2010, the control pin 2020 is momentarily switched to Ground and a 12 VDC pulse is applied to pin 2040 for 20 msec. The pulse goes through both inductor coils.

The momentary magnetic field generated in the two coils pushes the magnet(s) to the left. The Left Coil 1370L attracts the North pole of the magnet(s) and 1370R repels the South pole so that the magnet sticks to the left ferromagnetic screw, causing the osculating contact 2110 to make solid con act with 2100, the Voltage/Current Input/Output Pin-1 Static Contact and current flows with no further activation or detent current required.

In order to flip the Relay to Position 2 on the right simply reverse the process by momentarily holding pin 2040 to Ground and applying a 12 VDC pulse for 20 msec to pin 2020.

An alternative method for flipping the relay is to tie one of the Control pins to ground either 2020 or 2040 and pulse the other pin with +12 VDC then −12 VDC alternately to flip it back and forth.

This Multi-Stable Relay in the Figures of 19, 20, 21 is an element in providing Control in this EMC System. They are normally equipped with a sub-Gigahertz wireless unit so that the Gateway 220 can turn them on and off based on normal preset cycles or problem conditions or due to commands received over the Internet.

Referring back to FIG. 2 and also to FIG. 21, 2190 is the Wireless Thermostat which is another control element of this Energy Management and Control System. This Thermostat contains an RF wireless Tx/Rx radio and is controlled directly through the wireless radio in the Gateway Module 220. The Gateway Module 220 is connected to the PeakPower Server 230 via the Internet either wired or wirelessly via Cellular wireless e.g. 3G) radio. So the end user or Energy Management person is able to change the thermostat from virtually anywhere in the world.

In addition to Linux, A local database and real-time database management software are on the Gateway module. Each Sensor or End Device Time Tags the raw data in a telemetry data-flow Tag-Data format and pushes it to the local Gateway over the local network (PLC or RF). The local RF Network may use many bands (e.g. 315 MHz, 433 MHz, 915 MHz, 2.4 GHz) Each local network may use 802.15 or a proprietary protocol stack. Each Gateway node can buffer a period (e.g., a minimum of one week, one day, one month, etc.) of the local buildings real-time data in case there is a communications outage. The Gateway node forwards time tagged real-time data to the main Server(s) in a telemetry data-flow Tag-Data format using a binary protocol such as SNMP wire protocol, ASN.1. Each node has an EUI-64 address to maximize compatibility, and so that each node may run identical software images to eliminate the need for per node configuration, thus simplifying provisioning, deployment, updates and support. Any or all nodes may receive software or firmware updates via remote wireless update.

All data is processed and analyzed on-the-fly as it reaches the main Server(s) in the cloud. Then both the real-time data and the results are stored in the Relational Database Management System (RDBMS) simultaneously. This eliminates the need to thrash the RDBMS.

Secure data handling is ensured using Secure Socket Layer (SSL) streams and certificates.

The Graphical User interface (GUI) and charts (see FIG. 25) support HTML5 as well as FLASH and Javascript for legacy browsers. The GUI receives and renders all data in real-time with no polling required. The operator may also scroll back in time to look at historical data, which would begin scrolling from that point for a period until a User Inactivity Timeout is hit, then it reverts back to real-time data.

FIG. 22 depicts a graph relative to a PeakPower System in accordance with disclosed embodiments. The disclosed PeakPower System flattens costly peak power usage, 2200 Peak Energy Costs can be as much as 10 times non-peak rates, 2210 The PeakPower System tracks the Peak Hours daily and pre-coots and/or adjusts defrost cycles to flatten the peaks. No the three regular On cycles versus one using Peak Power System automated scheduling.

FIG. 22 illustrates how the PeakPower System flattens costly peak power usage.

The PeakPower System realizes major energy savings using is peak flattening using the RLSO-CTs, software, algorithms and control methodologies.

Certain hours of the day, the electric companies experience Peak Demand and they charge commercial customers based on that peak usage which can cost up to 10x the regular rates 2200. The PeakPower System daily gleans this information from the web so it can determine when these peak times are, then it real-time schedules all equipment for pre-cooling of all freezers, chillers, coolers, HVACs etc, before the peak times, to minimize impact. Also the PeakPower System actively schedules any defrost cycles on and around these peak usage times 2210 to again minimize or flatten the peak usage. A large percentage of the power consumed in equipment is the Startup cycle, and the PeakPower System minimizes the number of Start Cycles 2210. Shown in 2200 are typical daily Peak Power price curves in California. It is similar for other states and other countries. PeakPower software tracks based on location of each installation.

FIG. 23 depicts a graph relative to Mean Time Before Failure (MTBF) accordance with disclosed embodiments. All Equipment has a Mean Time Before Failure (MTBF) and a signature, 2300 various equipment have varying MTBF times, 2310 The Power On Signature of this compressor spikes to over 4x normal then settles in about half a second to about 40 Amps 2320. The steady state signature of this compressor is about 40 Amps.

FIG. 23 illustrates how All Equipment has a Mean Time Before Failure (MTBF) and a signature for Power-On as well as steady state.

Many of the common equipment types used in supermarkets can fail fairly quickly after installation:

Chillers: min MBTF of 18,000 hours=2.1 years of use;

Compressors: mM MBTF of 34,000 hours=3.9 years of use;

Condensers: min MBTF of 26,000 hours=3.0 years of use; and

Air handling Units: min MBTF of 24,000 hours=2.7 years of use.

It is important to note that the real problem is not the individual parts of the refrigeration system failing, but the system as a whole failing. The cumulative MTBF of multiple pieces of equipment (whether it is the same type or different types) is represented by:

$$\lambda = \frac{1}{1/\lambda_1 + 1/\lambda_2 + \ldots + 1/\lambda_n}$$

For instance, if you have sixteen compressors, which many supermarkets do, then the overall MBTF for Compressors alone is 2,125 hours.

This means that you will likely have a compressor failure about four times per year. For sixteen condensers, the overall MBTF is 1,625 hours. That is almost six times per year.

With 16 compressors AND 16 condensers at the same location, the MTBF there is 920 hours. That is almost 10 failures per year, almost once a month. PeakPower Commander acts like a sentinel, silently watching for subtle signs and adjusting power levels, temperatures, or equipment features. It warns of trouble before a problem starts to become critical, such as days or potentially weeks before a problem goes critical. A silent page or text on your cell phone or computer to alert you to the fact that something is going amiss, prompting maintenance persons to proactively fix it, replace a filter, etc. before it becomes an emergency. This would also solve problems with dirt accumulation or wearing down on equipment, showing up as increased power consumption. Detecting dirty filters can save 5% per year, by way of one example.

2310 illustrates the Power-On signature of a compressor and FIG. 2320 illustrates the steady state signature of that same compressor, prior to the bearings starting to overheat, which causes it to draw more power.

2320 illustrates another area of energy savings. When a compressor starts to fail, it exhibits a distinctive increase in power consumption. In this case, over a 42 day (6 weeks) time period, the energy consumed by this compressor rose by 50% from 40 KWhr to 60 KWhr. It is nonlinear, so the average is about 15% aver six weeks.

Since the MTBFs are about 10 failures per year for most medium to large stores, this translates into an average of over 15% per month overall. This same failure mechanism is exhibited on the other types of equipment in a supermarket also, condensers, fans, etc.

FIG. 24 depicts a graph relative to a compressor Power-CM Signature in accordance with disclosed embodiments. FIG. 24: A compressor Power-On Signature showing the Analog to Digital sampling rate during Power on is about 100 Hz.

FIG. 24 illustrates how the PeakPower System acquires the high resolution signature used for processing and analyzing the Power-On signatures. During Steady State mode it is sufficient to sample every 10 sec, to 15 sec, normally, but during Power-On when the power spikes over 3× normal, it samples more quickly to get all the time domain and frequency domain parameters. There is a supercap onboard the PeakPower Commander module to save energy for the Power-On cycle to sample at 100 Hz or higher, immediately when a non-zero transition is detected using an analog comparator.

FIG. 25 depicts an Interactive Portal for monitoring in accordance with disclosed embodiments. FIG. 25: The Interactive Portal provides 24×7×365 monitoring, alerts and alarms continuously. 2500 Freezer 4 "Idiot Light" and Chart Border are both Red, indicating an Alarm Condition, 2510 Compressor 4 "Idiot Light" and Chart Border are both Yellow, indicating an Alert Condition, 2520 Cooler 4 "Idiot Light" and Chart Border are both Green, indicating a Normal Condition.

Further illustrating a User Interface Screen for observing, managing and interacting with the PeakPower System. When an ALARM occurs, an "idiot light" button at the upper left corner of the screen goes red and pushes all other buttons down one level (shifts to the right and down). Also the chart for that particular device pops up to the upper left corner of the chart area and it is background turns from green to red. If an ALERT occurs it pops up to the level just below the lowest (oldest) red ALARM chart. If there are already 4 red ALARM Charts on the screen, it will appear on screen 2,3,4 . . . (see vertical scroll bar on the right) and the background color will change from green to yellow. The idiot light at the top of the screen will turn yellow, unless the top of the screen is full of Reds already, then it will appear on idiot light screen 2,3,4, . . . (see small vertical scroll bar on the right).

The scroll bar below each chart allows the operator to scroll back in time to see where a parameter may have gone out of limits. The operator could scroll back a day, a month, a year if they wish. After 30 seconds of inactivity by the operator, all charts revert back to real-time.

FIG. 26 depicts a PeakPower System Configuration Setup interface in accordance with disclosed embodiments. FIG. 26: The PeakPower System Configuration Setup Screen, 2600 Equipment, Sensors and Controllers icons to place on store map and configure them. 2610 Placing wiring and plumbing of equipment, sensors, and controllers, Element 2620 represents a building map or store map for placing and wiring equipment onto when establishing a new building site or store using an Administration Tool as an interface. For example, such an interface enables the following operations in which:

An operator scans in the architectural layout of the store (i.e. plumbing of the cooling conduits, etc.).

The Operator selects the Manufacturer and Model Number for each type equipment being monitored as it is placed on the schematic drawing of the building, a pulldown menu will appear.

If one or more of these types of equipment is already in the Real Signature Master Database, i.e. the cross-store database, then the saved Preliminary Signature Model of that model of equipment is fetched from the database and automatically loaded to preset Alerts/Alarms/Limits.

If that model of equipment is not already in the library, a Webcrawler SubRoutine Software scours the web and to Obtains a manufacturer's spec.

The Administration Tool builds a rough Preliminary Signature Model based on that spec. and general industry knowledge about the equipment's behavior curves.

The Adaptive software of the Administration Tool gathers three end to end sequences, then establishes a baseline "Real Signature Model 1" based on a high degree of correlation between runs, then correlates the resulting "Real Signature Model 1" to the Preliminary Signature Model to determine if it is within a margin of error (+/−10%) of the manufacturers actual specs. If it is off more than (+/−10%) another three end to end sequences are collected and another baseline, "Real Signature Model 2" is established and it is correlated with both the Preliminary Signature Model and the "Real Signature Model 1" to determine if there is a correlation within (+/−10%) of either. If there is correlation between either, the baseline is established for that piece of equipment, if not, it continues on to collect three more runs and determines "Real Signature Model 3," etc., until a repeatable model is fully determined. If the established model is outside a +3% corridor of the Manufacturer's spec, an ALERT is Set. If it is outside a +5% corridor an ALARM is Set.

If there is similar equipment in the Real Signature Master Database, then the Cross Correlation SubRoutine automatically run on one, two or three found, depending on if there is only one or only two in the Real Signature Master Database, If there is more than +/−10% variance between the new one and the one(s) in the Database an Alarm is generated, otherwise the entry is flagged as "GOOD" to the operator who is installing it.

These real-time calibration runs may require about ½ hour to one hour each, because a full cycle of cooling (Compressor On) and warming (Compressor Oft) requires a minimum duration of time FIG. 27 is a flow diagram illustrating a method 2700 relative to implementing a roll-lock snap-on current transformer in accordance with disclosed embodiments. Method 2700 may be performed by processing logic that may include hardware (e.g., circuitry, dedicated logic, programmable logic, microcode, etc.), software (e.g., instructions run on a processing device to perform various operations in pursuit of implementing the disclosed a roll-lock snap-on current transformer. In one embodiment, method 2700 is performed by a hardware based system having an administrative interface enabled thereon via, for example, a processor and a memory computationally coupling the hardware based system and the administrative interface. Some of the blocks and/or operations listed below are optional in accordance with certain embodiments. The numbering of the blocks presented is for the sake of clarity and is not intended to prescribe an order of operations in which the various blocks must occur.

Method 2700 begins with processing logic for receiving a scan of an the architectural layout including components of a store (block 2705).

At block 2710, processing logic selects a Manufacturer and Model Number for each type equipment to be monitored.

At block 2715, processing logic retrieves data from a database based on the Manufacturer and Model Numbers selected.

At block 2720, processing logic sets one or more default/pre-set Alerts, Alarms, and/or Limits.

At block 2725, processing logic builds Preliminary Signature Model based on retrieved data.

At block 2730, generates a baseline Real Signature Model based on three end to end sequences to establish correlation between runs.

At block 2735, processing logic re-generates one or more subsequent Real Signature Models until a repeatable model is determined.

At block 2740, processing logic performs cross-correlation for available in a Real Signature Master Database.

At block 2745, processing logic generates a good flag or an alarm based on determined variance.

At block 2750, processing logic instructs an operator to proceed with installation (or conduct corrective action as appropriate) based on a flag, alert, and/or alarm.

White the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

What is claimed is:

1. A form factor to clamp upon a power line, the form factor comprising:
   a current transformer to measure an electrical current of the power line;
   a power monitoring device to receive the measurement of the electrical current of the power line; and
   a transceiver communicatively interfaced with the power monitoring device, wherein the transceiver is to communicate data representative of the measurement of the electrical current external to the form factor;
   wherein the form factor to clamp upon the power line is formed from a double semicircle coil in which each of two halves forming the double semicircle coil are hingedly attached at a top side of the double semicircle coil which permit each of the two halves of the double semicircle coil to separate at a bottom side of the semicircle coil; and
   further wherein a face at the bottom end of each of the two halves of the double semicircle coil comprise one or more rollers to permit each face to roll over a surface of the power line to be clamped upon during installation and removal of the form factor.

2. The form factor of claim 1, wherein the transceiver to communicate the data representative of the measurement of the electrical device external to the form factor comprises the transceiver to communicate the data to a data collection gateway, and wherein the data collection gateway to forward the data to a central data collection server responsive to receiving the data from the transceiver of the form factor.

3. The form factor of claim 1, wherein the transceiver is powered via energy derived from an electromagnetic field of the power line.

4. The form factor of claim 3, wherein the form factor further comprises a capacitor to receive the energy derived from the electromagnetic field of the power line, and wherein the transceiver powered via the energy comprises the transceiver to draw power from the capacitor to operate.

5. The form factor of claim 1, wherein the transceiver is a wireless transceiver capable of transmitting the data and receiving instruction.

6. The form factor of claim 1, wherein the transceiver is a power line controller capable transceiver to transmit data via the power line and to further receive instructions which are communicated to the transceiver via the power line.

7. The form factor of claim 1, wherein the form factor is a tail-free form factor having no wire, tail, or interface lead external to an exterior surface of the form factor.

8. The form factor of claim 1, wherein the clamped upon power line comprises an electrical power line having a live electrical current traversing thereupon.

9. The form factor of claim 1, wherein the form factor is installable within a power panel having a plurality of circuit breakers therein, in which the form factor permits a door of the power panel to close without wires protruding through the door of the power panel.

10. The form factor of claim 1, wherein the form factor constitutes a first form factor, and wherein a second form factor and a third form factor operate in conjunction with the first form factor to monitor a three-phase current upon the electrical current of the power line, wherein each of the first form factor, the second form factor, and the third form factor are respectively clamped upon one of three wires of the power line carrying the three-phase current.

11. The form factor of claim 10, wherein the first form factor, the second form factor, and the third form factor are clamped upon the three wires of the power line carrying the three-phase current adjacent to a three-phase circuit breaker for the power line, where each of the three wires exit the three-phase circuit breaker.

12. The form factor of claim 10, wherein the first form factor, the second form factor, and the third form factor are clamped upon the three wires of the power line carrying the three-phase current within an electrical apparatus which is electrically interfaced to the power line and which is powered by the power line.

13. The form factor of claim 1, wherein the current transformer measures the electrical current of the power line by producing a reduced current accurately proportional to the electrical current of the power line, and wherein the reduced current is input directly into the power monitoring device of the form factor.

14. The form factor of claim 1, wherein the form factor constitutes a roll-lock snap-on current transformer power monitoring device.

15. The form factor of claim 14, wherein the roll-lock snap-on current transformer power monitoring device having the transceiver therein to communicate data representative of the measurement of the electrical device comprises the roll-lock snap-on current transformer power monitoring device to communicate data to a peak power system having functionality to simultaneously monitor a plurality of roll-lock snap-on current transformer power monitoring devices.

16. A method comprising:
selecting a power line to be monitored, the power line comprising a live electrical current traversing thereupon;
clamping a roll-lock snap-on current transformer power monitoring device onto the power line to be monitored without interrupting the live electrical current traversing the power line; and
receiving data from the roll-lock snap-on current transformer power monitoring device which is clamped upon the power line, wherein the data is representative of a measurement of the live electrical current traversing the power line;
wherein the roll-lock snap-on current transformer clamped upon the power line is formed from a double semicircle coil in which each of two halves forming the double semicircle coil are hingedly attached at a top side of the double semicircle coil which permit each of the two halves of the double semicircle coil to separate at a bottom side of the semicircle coil; and
further wherein a face at the bottom end of each of the two halves of the double semicircle coil comprise one or more rollers to permit each face to roll over a surface of the power line to be clamped upon during installation and removal of the roll-lock snap-on current transformer.

17. The method of claim 16, wherein the roll-lock snap-on current transformer power monitoring device comprises:
(i) a current transformer to measure the live electrical current of the power line,
(ii) a power monitoring device to receive the measurement of the live electrical current of the power line, and
(iii) a transceiver communicatively interfaced with the power monitoring device, wherein the transceiver to communicate the data representative of the measurement of the electrical current.

18. The method of claim 17, wherein receiving the data from the roll-lock snap-on current transformer power monitoring device which is clamped upon the power line comprises receiving the data via a data collection point external to the roll-lock snap-on current transformer power monitoring device via wireless interface or a power line controller interface.

19. A peak power system comprising:
a central data collection server to collect telemetric data; and
a plurality of roll-lock snap-on current transformer power monitoring devices;
each of the plurality of roll-lock snap-on current transformer power monitoring devices being formed from a double semicircle coil in which each of two halves forming the double semicircle coil are hingedly attached at a top side of the double semicircle coil which permit each of the two halves of the double semicircle coil to separate at a bottom side of the semicircle coil and further wherein a face at the bottom end of each of the two halves of the double semicircle coil comprise one or more rollers to permit each face to roll over a surface of the power line to be clamped upon during installation and removal of the respective roll-lock snap-on current transformer power monitoring device.

20. The peak power system of claim 19, wherein each of the plurality of roll-lock snap-on current transformer power monitoring devices comprises:
a current transformer to measure a live electrical current of a power line upon which each of the plurality of roll-lock snap-on current transformer power monitoring devices is clamped upon;
a power monitoring device to receive a measurement of the live electrical current of the respective power line; and
a transceiver communicatively interfaced with the power monitoring device, wherein the transceiver is to communicate the data representative of the measurement of the electrical current to the central data collection server.

21. The peak power system of claim 19, further comprising:
a peak power system interface, the interface to implement operations comprising:
selecting a manufacturer and model number for each of a plurality of equipment to be monitored;
retrieving equipment signatures from a database based on the manufacturer and model numbers selected;
analyzing the collected telemetric data based on the retrieved equipment signatures;
generating a good flag, an alert, or an alarm for each equipment selected to be monitored based on determined variance derived from a comparison of the retrieved signatures to a corresponding one of the plurality of the equipment to be monitored; and
instructing an operator via the peak power system interface based on the generated flag, alert, or alarm.

* * * * *